US010134566B2

(12) United States Patent
David et al.

(10) Patent No.: US 10,134,566 B2
(45) Date of Patent: Nov. 20, 2018

(54) METHOD OF MAKING A NANOSTRUCTURE AND NANOSTRUCTURED ARTICLES

(71) Applicant: 3M INNOVATIVE PROPERTIES COMPANY, St. Paul, MN (US)

(72) Inventors: Moses M. David, Woodbury, MN (US); Ta-Hua Yu, Woodbury, MN (US); Daniel S. Bates, Ham Lake, MN (US); Jayshree Seth, Woodbury, MN (US); Michael S. Berger, White Bear Lake, MN (US); Carsten Franke, St. Paul, MN (US); Sebastian F. Zehentmaier, Obing (DE)

(73) Assignee: 3M INNOVATIVE PROPERTIES COMPANY, St. Paul, MN (US)

(*) Notice: Subject to any disclaimer, the term of this patent is extended or adjusted under 35 U.S.C. 154(b) by 182 days.

(21) Appl. No.: 14/895,693

(22) PCT Filed: Jul. 23, 2014

(86) PCT No.: PCT/US2014/047782
§ 371 (c)(1),
(2) Date: Dec. 3, 2015

(87) PCT Pub. No.: WO2015/013387
PCT Pub. Date: Jan. 29, 2015

(65) Prior Publication Data
US 2016/0141149 A1    May 19, 2016

Related U.S. Application Data

(60) Provisional application No. 61/858,670, filed on Jul. 26, 2013, provisional application No. 61/867,733, filed on Aug. 20, 2013, provisional application No. 62/018,761, filed on Jun. 30, 2014.

(51) Int. Cl.
B32B 3/20     (2006.01)
H01J 37/32    (2006.01)
G09B 19/00    (2006.01)

(52) U.S. Cl.
CPC ........ *H01J 37/32009* (2013.01); *G09B 19/00* (2013.01); *H01J 2237/332* (2013.01); *H01J 2237/334* (2013.01)

(58) Field of Classification Search
None
See application file for complete search history.

(56) References Cited

U.S. PATENT DOCUMENTS

| | | |
|---|---|---|
| 4,340,276 A | 7/1982 | Maffitt |
| 4,375,158 A | 3/1983 | Eichmanns |
| 5,888,594 A | 3/1999 | David |
| 6,399,177 B1 | 6/2002 | Fonash |
| 6,582,823 B1 | 6/2003 | Sakhrani et al. |
| 6,726,979 B2 | 4/2004 | Friedman |
| 7,112,531 B2 | 9/2006 | Srinivasan |
| 2002/0016080 A1 | 2/2002 | Khan et al. |
| 2002/0192441 A1 | 12/2002 | Kalkan |
| 2004/0023508 A1 | 2/2004 | Chinn |
| 2005/0184641 A1 | 8/2005 | Armitage |
| 2005/0233083 A1 | 10/2005 | Schulz |
| 2005/0260864 A1 | 11/2005 | Huang et al. |
| 2007/0248768 A1 | 10/2007 | Loboda et al. |
| 2009/0069662 A1 | 3/2009 | Rongen |
| 2013/0038949 A1* | 2/2013 | David ................... B29C 59/14 359/742 |

FOREIGN PATENT DOCUMENTS

| | | | |
|---|---|---|---|
| CN | 102883870 A | 1/2013 | |
| JP | 2001-044172 | 2/2001 | |
| JP | 2004-500481 | 1/2004 | |
| WO | WO 2011-139593 | 11/2011 | |
| WO | WO 2011139593 A1 * | 11/2011 | ............ B29C 59/14 |

OTHER PUBLICATIONS

International Search report for PCT International Application No. PCT/US2014/047782 dated Nov. 5, 2014, 5 pages.

* cited by examiner

*Primary Examiner* — Christopher M Polley
(74) *Attorney, Agent, or Firm* — James A. Baker

(57) ABSTRACT

A method of making a nanostructure and nanostructured articles by depositing a layer to a major surface of a substrate by plasma chemical vapor deposition from a gaseous mixture while substantially simultaneously etching the surface with a reactive species. The method includes providing a substrate; mixing a first gaseous species capable of depositing a layer onto the substrate when formed into a plasma, with a second gaseous species capable of etching the substrate when formed into a plasma, thereby forming a gaseous mixture; forming the gaseous mixture into a plasma; and exposing a surface of the substrate to the plasma, wherein the surface is etched and a layer is deposited on at least a portion of the etched surface substantially simultaneously, thereby forming the nanostructure. The substrate can be a (co)polymeric material, an inorganic material, an alloy, a solid solution, or a combination thereof. The deposited layer can include the reaction product of plasma chemical vapor deposition using a reactant gas comprising a compound selected from the group consisting of organosilicon compounds, metal alkyl compounds, meal isopropoxide compounds, metal acetylacetonate compounds, metal halide compounds, and combinations thereof. Nanostructures of high aspect ratio and optionally with random dimensions in at least one dimension and preferably in three orthogonal dimensions can be prepared.

20 Claims, 8 Drawing Sheets

600nm

METHOD OF MAKING A NANOSTRUCTURE AND NANOSTRUCTURED ARTICLES

CROSS REFERENCE TO RELATED APPLICATIONS

This application is a national stage filing under 35 U.S.C. 371 of PCT/US2014/047782, filed Jul. 23, 2014, which claims priority to U.S. Application No. 61/858,670, filed Jul. 26, 2013; US Application No. 61/867,733, filed Aug. 20, 2013; and U.S. Application No. 62/018,761, filed Jun. 30, 2014, the disclosures of which are incorporated by reference in their entirety herein.

FIELD

Methods are disclosed for producing nanostructures on surfaces of articles, more particularly, methods for producing nanostructures on surfaces of (co)polymeric substrates.

BACKGROUND

Nanostructures have been found to impart useful properties on surfaces of articles. These useful properties include useful optical properties; such as, for example, reflection reduction of plastic substrates; useful physical properties, such as, for example, surface modification for improved adhesion; and useful structural properties for creating features on surfaces that can be useful in, for example, drug delivery.

A number of methods have been used to produce nanostructures on surfaces of non-(co)polymeric substrates. For example, plasma etching is a useful method that has been used to generate nanostructures. A particular type of plasma etching, reactive ion etching (RIE) has been widely employed in the semiconductor industry to produce submicron features on silicon substrates useful in electronics. Recently, high density plasma processes have been developed that can produce nanostructures on silicon in the sub-100 micrometer range. The semiconductor industry is currently working on the fabrication of nanoscale features on silicon wafers with around 40 nm resolution, using patterning and pattern transfer based on advanced plasma processing tools.

Plasma treatment has also been used to produce antireflective surfaces on (co)polymeric substrates, including transparent (co)polymeric substrates. Many of these treatments are batch processes and can produce only limited antireflective regions on the substrates. Co-pending and commonly assigned PCT Pat. Pub. WO 2011/139593 describes methods to produce nanostructures on surfaces in a substantially continuous manner.

SUMMARY

Although plasma processes have been used to produce nanostructures on surfaces of non-conductive substrates such as (co)polymeric films, when any of the individual dimensions of the nanostructures reach a scale below about 200 micrometers, charging effects of the surface features by the plasma generally prevent pattern transfer of features having high aspect ratios.

Furthermore, known methods for creating sub-wavelength (e.g. nanoscale) surface structure tend to be complicated and expensive batch processes. For example, the method disclosed in U.S. Pat. Publ. No. 2005/0233083 (Schultz et al.) involves bombarding a (co)polymeric surface with an Ar/$O_2$ plasma under vacuum conditions of less than 0.5 mTorr (0.067 N/m$^2$). This requirement of extreme vacuum conditions severely limits the commercial viability of this method, particularly for continuous, roll-to-roll production of nanostructured (co)polymeric substrates. In addition, U.S. Pat. No. 4,374,158 (Taniguchi et al.) describes a gas activation method for creating sub-wavelength surface structures. This batch process employs a plasma etcher to isotropically etch samples in an oxygen-containing gas. The resulting isotropically etched surfaces require an additional coating to provide sufficient durability for practical applications. Thus, there is a heretofore unmet need to provide methods for producing nanostructured surfaces on non-conductive substrates, more particularly durable, high aspect ratio nanostructured features on (co)polymeric substrates, in a single stage, continuous operation.

In various exemplary embodiments described herein, the disclosed methods may be used for creating nanostructures on substrates, including non-conductive (co)polymeric substrates, and nanostructured articles, in a continuous, roll-to-roll process. The disclosed methods may be applied to large areas of substrates such as, for example, rolls of plastic substrates. Films and surfaces produced by the disclosed methods may be useful, for example, in liquid crystal (LCD) or light-emitting-diode (LED) displays, for light extraction, for solar applications, for surface adhesion modification, and for chemical catalysis. The disclosed methods may also produce surfaces that can be hydrophilic, hydrophobic, antistatic, conductive, antifogging, or even antimicrobial.

Thus, in one aspect, the disclosure provides a method of making a nanostructure that includes providing a substrate, mixing a first gaseous species capable of depositing a layer onto the substrate when formed into a plasma with a second gaseous species capable of etching the substrate when formed into a plasma, thereby forming a gaseous mixture, forming the gaseous mixture into a plasma, and exposing a surface of the substrate to the plasma, wherein the surface is etched and a layer is deposited on at least a portion of the etched surface substantially simultaneously, thereby forming a nanostructure.

Further, when the substrate is a fluoropolymer, the above techniques provide exceptional adhesion to adjacent layers that may be applied by coating, laminating, or compression onto the nanostructure. Thus, in another aspect, the disclosure provides that where the substrate is a fluoropolymer, the method may further comprise contacting the nanostructure with a film or a film-forming material so as to form a multi-layered laminate. Fluoropolymers are notoriously difficult to make adhesion to, and with the techniques of this disclosure, it is possible to form a multilayered laminate where the adhesive strength between the film and the nanostructure is greater than the cohesive strength of the film.

In some exemplary embodiments of the foregoing, the substrate can be a non-conductive substrate, for example a substrate including a (co)polymer (e.g. a (co)polymeric film), a fiber, a glass, a composite, a microporous membrane and combinations thereof. In certain such exemplary embodiments, the substrate can be transparent to visible light and can include (co)polymers such as poly(methyl methacrylate), poly(ethylene terephthalate), polycarbonate, cellulose, triacetate, polyamide, polyimide, a fluoropolymer, a polyolefin, a siloxane (co)polymer, a cyclic olefin (co)polymer, a polyurethane and combinations thereof.

In certain such exemplary embodiments, the first gaseous species includes a compound selected from the group consisting of organosilicon compounds, metal alkyl compounds, metal isopropoxide compounds, metal oxide compounds, metal acetylacetonate compounds, metal halide compounds, and combinations thereof. The second gaseous species can be, in some such exemplary embodiments, oxygen, a fluorocarbon, nitrogen trifluoride, sulfur hexafluoride, chlorine, hydrochloric acid, methane, and combinations thereof. In some exemplary embodiments, an inert carrier gas, such as argon, can typically be mixed in with the second gaseous species.

In some particular exemplary embodiments of any of the foregoing, the nanostructure can have a dimension of less than about 400 nanometers (nm). In certain such exemplary embodiments, the nanostructure can have a dimension of less than about 40 nm. Articles that have at least one nanostructured surface can also be made by the disclosed methods.

In some exemplary embodiments of any of the foregoing, the nanostructured surfaces prepared by the provided method can exhibit a significant reduction in reflectance compared to an unstructured surface comprising the same materials. In additional exemplary embodiments of any of the foregoing, the nanostructured articles can be durable and possess scratch resistance.

In certain exemplary embodiments of any of the foregoing, the disclosed methods can be carried out at moderate vacuum conditions (for example, between about 5 mTorr (0.67 N/m$^2$) and about 10 mTorr (1.33 N/m$^2$)). In some such embodiments, the disclosed methods can be carried out in a continuous process. In some particular embodiments, the disclosed methods can also be carried out as a roll-to-roll process, at a single station positioned in a continuous web transport line. In such exemplary embodiments, the disclosed methods satisfy a heretofore unmet need in the art for a method of making durable, high aspect ratio nanostructured features on non-conductive substrates, for example (co)polymeric films, that is continuous and comparatively inexpensive.

Various exemplary embodiments of the present disclosure are further illustrated by the following listing of embodiments, which should not be construed to unduly limit the present disclosure:

LISTING OF EXEMPLARY EMBODIMENTS

A. A method of making a nanostructure, comprising:
providing a substrate;
mixing a first gaseous species capable of depositing a layer onto the substrate when formed into a plasma, with a second gaseous species capable of etching the substrate when formed into a plasma, thereby forming a gaseous mixture;
forming the gaseous mixture into a plasma; and
exposing a surface of the substrate to the plasma, wherein the surface is etched and a layer is deposited on at least a portion of the etched surface substantially simultaneously, thereby forming a nanostructure.

B. A method of making a nanostructure according to embodiment A, wherein the substrate comprises a (co)polymeric material, an inorganic material, an alloy, a solid solution, and combinations thereof.

C. A method of making a nanostructure according to embodiment B, wherein the (co)polymeric material comprises a (co)polymer selected from poly(methyl methacrylate), poly(ethylene terephthalate), polycarbonate, cellulose, triacetate, polyamide, polyimide, a fluoropolymer, a polyolefin, a siloxane (co)polymer, a cyclic olefin (co)polymer, or a polyurethane, and combinations thereof.

D. A method making a nanostructure according to embodiment C, wherein the (co)polymer is a polytetrafluoroethylene fluoropolymer and the surface of the substrate is substantially colorless after exposure to the plasma.

E. A method of making a nanostructure according to embodiment C, wherein the substrate comprises a transparent (co)polymer.

F. A method of making a nanostructure according to any preceding embodiment, wherein the first gaseous species comprises a compound selected from the group consisting of organosilicon compounds, metal alkyl compounds, metal isopropoxide compounds, metal oxide compounds, metal acetylacetonate compounds, and metal halide compounds, and combinations thereof.

G. A method of making a nanostructure according to embodiment F, wherein the organosilicon compounds comprise tetramethylsilane, trimethylsilane, hexamethyldisiloxane, tetraethylorthosilicate, or a polyhedral oligomeric silsesquioxane, and combinations thereof.

H. A method of making a nanostructure according to any preceding embodiment, wherein the second gaseous species comprises oxygen, a fluorocarbon, nitrogen trifluoride, sulfur hexafluoride, chlorine, hydrochloric acid, methane, and combinations thereof.

I. A method of making a nanostructure according to embodiment H, wherein the fluorocarbon is selected from tetrafluoromethane, perfluoropropane, and combinations thereof.

J. A method of making a nanostructure according to any preceding embodiment, wherein the gaseous mixture further comprises argon.

K. A method of making a nanostructure according to any preceding embodiment, wherein the nanostructure has a dimension of less than about 400 nanometers.

L. A method of making a nanostructure according to embodiment K, wherein the nanostructure has a dimension of less than about 40 nanometers.

M. A method of making a nanostructure according to any preceding embodiment, performed in a substantially continuous manner.

N. An article made from the method according to any preceding method embodiment.

O. An article according to embodiment N, having a Reflectance of less than 3% and a Haze Delta of less than 0.5%.

P. An article according to embodiment O, having a Reflectance of less than 2% and a Haze Delta of less than 0.5%.

Q. An article according to embodiment P, having a Reflectance of less than 1% and a Haze Delta of less than 0.5%.

R. An article according to any one of embodiments N, O, P or Q, wherein the etched surface has at least one nanostructure with an aspect ratio greater than 2:1.

S. An article according to embodiment R, wherein the etched surface has at least one nanostructure with an aspect ratio greater than 15:1.

T. An article according to any one of embodiments N, O, P, Q, R or S, wherein the deposited species is present over substantially the entire etched surface.

U. The article according to any one of embodiments N, O, P, Q, R, S, or T, wherein the concentration of the deposited species varies continuously according to the depth from the exposed surface.

V. The article according to any one of embodiments N, O, P, Q, R, S, T, or U, wherein the exposed surface comprises silanol groups.

W. The article according to any one of embodiments N, O, P, Q, R, S, T, U, or V, further comprising a layer of pressure sensitive adhesive adhered to the exposed surface.

X. The article according to embodiment W, wherein the pressure sensitive adhesive and the substrate are UV stable.

Y. The article according to any one of embodiments N, O, P, Q, R, S, T, U, V, W or X, wherein the exposed surface has a pattern that is random in at least one dimension.

Z. The article according to embodiment Y, wherein the exposed surface has a pattern that is random in three orthogonal dimensions.

AA. A method of making a nanostructure according to embodiment A, wherein the substrate is a fluoropolymer, and the method further comprises contacting the nanostructure with a film or a film-forming material so as to form a multi-layered laminate.

AB. A method of forming a multilayered laminate, comprising:

providing a fluoropolymer film having at least a first surface, forming a nanostructure on a the first surface, and contacting the nanostructure with a film or a film-forming material so as to form a multi-layered laminate.

AC. A method of forming a multilayered laminate according to embodiment AB, wherein the adhesive strength between the film and the nanostructure is greater than the cohesive strength of the film.

AD. An article made from the method according to any one of embodiments AB and AC.

Various aspects and advantages of exemplary embodiments of the disclosure have been summarized. The above Summary is not intended to describe each illustrated embodiment or every implementation of the present certain exemplary embodiments of the present disclosure. The Drawings and the Detailed Description that follow more particularly exemplify certain preferred embodiments using the principles disclosed herein.

BRIEF DESCRIPTION OF THE DRAWINGS

The disclosure may be more completely understood in consideration of the following detailed description of various embodiments of the disclosure in connection with the accompanying drawings, in which it is to be understood by one of ordinary skill in the art that the drawings illustrate certain exemplary embodiments only, and are not intended as limiting the broader aspects of the present disclosure.

Figure 1A:
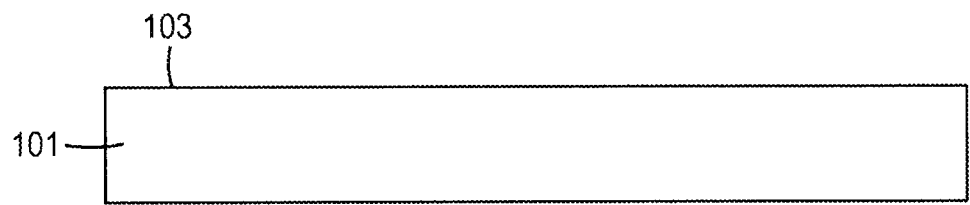
FIGS. 1a-1b are sequential schematic views of an embodiment of an article made by the provided method.

Repeated use of reference characters in the specification and drawings is intended to represent the same or analogous features or elements of the disclosure. While the above-identified drawings, which may not be drawn to scale, set forth various embodiments of the present disclosure, other embodiments are also contemplated, as noted in the Detailed Description.

DETAILED DESCRIPTION

In the following description, reference is made to the accompanying set of drawings that form a part of the description hereof and in which are shown by way of illustration several specific embodiments. It is to be understood that other embodiments are contemplated and may be made without departing from the scope or spirit of the present invention. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. At the very least, and not as an attempt to limit the application of the doctrine of equivalents to the scope of the claimed embodiments, each numerical parameter should at least be construed in light of the number of reported significant digits and by applying ordinary rounding techniques. In addition, the use of numerical ranges with endpoints includes all numbers within that range (e.g. 1 to 5 includes 1, 1.5, 2, 2.75, 3, 3.80, 4, and 5) and any narrower range or single value within that range.

Glossary

Certain terms are used throughout the description and the claims that, while for the most part are well known, may require some explanation. It should be understood that, as used herein:

The terms "about" or "approximately" with reference to a numerical value or a shape means +/−five percent of the numerical value or property or characteristic, but also expressly includes any narrow range within the +/−five percent of the numerical value or property or characteristic as well as the exact numerical value. For example, a temperature of "about" 100° C. refers to a temperature from 95° C. to 105° C., but also expressly includes any narrower range of temperature or even a single temperature within that range, including, for example, a temperature of exactly 100° C.

The term "substantially" with reference to a property or characteristic means that the property or characteristic is exhibited to within 98% of that property or characteristic, but also expressly includes any narrow range within the two percent of the property or characteristic, as well as the exact value of the property or characteristic. For example, a substrate that is "substantially" transparent refers to a substrate that transmits 98-100% of incident light.

The terms "a", "an", and "the" include plural referents unless the content clearly dictates otherwise. Thus, for example, reference to a material containing "a compound" includes a mixture of two or more compounds.

The term "or" is generally employed in its sense including "and/or" unless the content clearly dictates otherwise.

The term "molecular weight" as used throughout this specification means weight average molecular weight unless expressly noted otherwise.

The term "monomer" means a relatively low molecular weight material (i.e., having a molecular weight less than about 500 g/mole) having one or more radically polymerizable groups.

The term "oligomer" means a relatively intermediate molecular weight material having a molecular weight in a range from about 500 g/mole to about 10,000 g/mole.

The term "(co)polymer" means a relatively high molecular weight material having a molecular weight of at least about 10,000 g/mole (in some embodiments, in a range from 10,000 g/mole to 5,000,000 g/mole). The terms "(co)polymer" or "(co)polymers" includes homopolymers and copolymers, as well as homopolymers or copolymers that may be formed in a miscible blend, e.g., by co-extrusion or by reaction, including, e.g., transesterification. The term "(co) polymer" includes random, block and star (e.g. dendritic) (co)polymers.

The term "(meth)acrylate" with respect to a monomer, oligomer or means a vinyl-functional alkyl ester formed as the reaction product of an alcohol with an acrylic or a methacrylic acid.

The term "glass transition temperature" or "$T_g$" refers to the glass transition temperature of a (co)polymer when evaluated in bulk rather than in a thin film form. In instances where a (co)polymer can only be examined in thin film form, the bulk form $T_g$ can usually be estimated with reasonable accuracy. Bulk form $T_g$ values usually are determined by evaluating the rate of heat flow vs. temperature using differential scanning calorimetry (DSC) to determine the onset of segmental mobility for the (co)polymer and the inflection point (usually a second-order transition) at which the (co)polymer can be said to change from a glassy to a rubbery state. Bulk form $T_g$ values can also be estimated using a dynamic mechanical thermal analysis (DMTA) technique, which measures the change in the modulus of the (co)polymer as a function of temperature and frequency of vibration.

The term "anisotropic" refers to a feature or structure having a height to width (that is, average width) ratio (aspect ratio) of about 1.5:1 or greater (preferably, 2:1 or greater, more preferably, 5:1 or greater);

The term "nanoscale" refers to features or structures having a characteristic length, width or height of no more than one micrometer (1,000 nanometers), for example, between about 1 nanometer (nm) and about 1,000 nm, more preferably between about 1 nm and 500 nm, most preferably between about 5 nm and 300 nm);

The term "nanostructure" or "nanostructured" refers to an article having at least one nanoscale feature or structure, and preferably a plurality of nanoscale features or structures; and The term "plasma" refers to a partially ionized gaseous or fluid state of matter containing electrons, ions, neutral molecules, and free radicals.

The term "fluoropolymer" refers to a homopolymer or a copolymer derived from interpolymerized units of at least one of the following monomers: tetrafluoroethylene (TFE), vinylidene fluoride (VDF), vinyl fluorine (VF), hexafluoropropylene (HFP), chlorotrifluoroethylene (CTFE), fluoroalkyl vinyl ethers, fluoroalkoxy vinyl ethers, fluorinated styrenes, hexafluoropropylene oxide (HFPO), fluorinated siloxanes, or combinations thereof.

Various exemplary embodiments of the disclosure will now be described with particular reference to the Drawings. Exemplary embodiments of the present disclosure may take on various modifications and alterations without departing from the spirit and scope of the disclosure. Accordingly, it is to be understood that the embodiments of the present disclosure are not to be limited to the following described exemplary embodiments, but are to be controlled by the limitations set forth in the claims and any equivalents thereof.

A method of making a nanostructured surface on a substrate is disclosed herein. In some embodiments, the substrate can be in the form of a flat, continuous film. In other embodiments, the substrate can be an article that has at least part of one surface upon which it is desired to create a nanostructure. The substrate or article can be made of any material that can be etched by the methods disclosed herein. For example, the substrate can be a (co)polymeric material, an inorganic material, an alloy, or a solid solution. In some embodiments, the substrate can include a fiber, a glass, a composite, or a microporous membrane.

(Co)polymeric materials include thermoplastics and thermosetting plastics. Typical thermoplastics include, but are not limited to, polyethylene terephthalate (PET), polystyrene, acrylonitrile butadiene styrene, polyvinyl chloride, polyvinylidene chloride, polycarbonate, polyacrylates, thermoplastic polyurethanes, polyvinyl acetate, polyamide, polyimide, polypropylene, polyester, polyethylene, poly(methylmethacrylate), polyethylene naphthalate, polystyrene acrylonitrile, triacetate cellulose, nylon, silicone-polyoxamide polymers, fluoropolymers, cyclic olefin copolymers, and thermoplastic elastomers. Suitable thermosets include, but are not limited to, allyl resins, epoxies, thermosetting polyurethanes, and silicones or polysiloxanes. These resins can be formed from the reaction product of polymerizable compositions comprising at least one oligomeric urethane (meth)acrylate. Typically, the oligomeric urethane (meth) acrylate is a multi(meth)acrylate. The term "(meth)acrylate" is used to designate esters of acrylic and methacrylic acids, and "multi(meth)acrylate" designates a molecule containing more than one (meth)acrylate group, as opposed to "poly (meth)acrylate" which commonly designates (meth)acrylate polymers. Most often, the multi(meth)acrylate is a di(meth) acrylate, but it is also contemplated to employ tri(meth) acrylates, tetra(meth)acrylates and so on.

Oligomeric urethane multi(meth)acrylates may be obtained commercially, for example from Sartomer under the trade designation "PHOTOMER 6000 Series", such as "PHOTOMER 6010" and "PHOTOMER 6020", and also under the trade designation "CN 900 Series", such as "CN966B85", "CN964" and "CN972". Oligomeric urethane (meth)acrylates are also available from Surface Specialties, such as available under the trade designations "EBECRYL 8402", "EBECRYL 8807" and "EBECRYL 4827". Oligomeric urethane (meth)acrylates may also be prepared by the initial reaction of an alkylene or aromatic diisocyanate of the formula OCN—$R_3$—NCO with a polyol.

Most often, the polyol is a diol of the formula HO—$R_4$—OH wherein $R_3$ is a $C_{2-100}$ alkylene or an arylene group and $R_4$ is a $C_{2-100}$ alkylene group. The intermediate product is then a urethane diol diisocyanate, which subsequently can undergo reaction with a hydroxyalkyl (meth)acrylate. Suitable diisocyanates include 2,2,4-trimethylhexylene diisocyanate and toluene diisocyanate. Alkylene diisocyanates are generally useful. A compound of this type may be prepared from 2,2,4-trimethylhexylene diisocyanate, poly (caprolactone)diol and 2-hydroxyethyl methacrylate. In at least some cases, the urethane (meth)acrylate can be aliphatic. Also included can be (meth)acrylate esters having other functionality. Compounds of this type are exemplified by the 2-(N-butylcarbamyl)ethyl (meth)acrylates, 2,4-dichlorophenyl acrylate, 2,4,6-tribromophenyl acrylate, tribromophenoxylethyl acrylate, t-butylphenyl acrylate, phenyl acrylate, phenyl thioacrylate, phenylthioethyl acrylate, alkoxylated phenyl acrylate, isobornyl acrylate and phenoxyethyl acrylate. The reaction product of tetrabromobisphenol A diepoxide and (meth)acrylic acid is also suitable.

The other monomer may also be a monomeric N-substituted or N,N-disubstituted (meth)acrylamide, especially an acrylamide. These include N-alkylacrylamides and N,N-dialkylacrylamides, especially those containing $C_{1-4}$ alkyl groups. Examples are N-isopropylacrylamide, N-t-butylacrylamide, N,N-dimethylacrylamide and N,N-diethylacrylamide.

The other monomer may further be a polyol multi(meth) acrylate. Such compounds are typically prepared from aliphatic diols, triols, and/or tetraols containing 2-10 carbon atoms. Examples of suitable poly(meth)acrylates are ethylene glycol diacrylate, 1,6-hexanediol diacrylate, 2-ethyl-2-hydroxymethyl-1,3-propanediol triacylate (trimethylolpropane triacrylate), di(trimethylolpropane) tetraacrylate, pentaerythritol tetraacrylate, the corresponding methacrylates and the (meth)acrylates of alkoxylated (usually ethoxylated) derivatives of said polyols.

Monomers having two or more (ethylenically unsaturated groups can serve as a crosslinker. Styrenic compounds suitable for use as the other monomer include styrene, dichlorostyrene, 2,4,6-trichlorostyrene, 2,4,6-tribromostyrene, 4-methylstyrene and 4-phenoxystyrene. Ethylenically unsaturated nitrogen heterocycles include N-vinylpyrrolidone and vinylpyridine.

Useful inorganic materials for the substrate include, for example, glasses, metals, metal oxides, and ceramics. In some embodiments, inorganic materials include silicon, silicon oxide, germanium, zirconia, vanadium pentoxide, molybdenum, copper, titanium, titanium dioxide, gallium arsenide, diamond, aluminum oxide, silicon nitride, indium tin oxide, and tungsten carbide.

The provided method prepares articles that in some embodiments have the deposited species is present over all of the etched surface. In some of these embodiments, the concentration of the deposited species varies continuously according to the depth from the exposed surface. The exposed surface of the substrate can be a flat side of a (co)polymeric sheet or web. Alternatively, the exposed surface can be any surface of an article that can have enhanced optical, mechanical, electrical, adhesive, or catalytic properties by the production of nanostructures thereon.

The deposited species is the reaction product of plasma chemical vapor deposition derived from the first gaseous species. The first gaseous species may be a compound selected from organosilicon compounds, metal alkyls, metal isopropoxides, metal acetylacetonates and metal halides. Typically, the organosilicon compounds can include tetramethylsilane, trimethylsilane, hexamethyldisiloxane, tetraethylorthosilicate, or a polyhedral oligomeric silsesquioxane. Useful metal alkyls can comprise trimethylaluminum, tributylaluminum, tributyltin, or tetramethyl gallium. Useful metal isopropoxides can comprise titanium isopropoxide, or zirconium isopropoxide. Useful metal acetylacetonates can comprise platinum acetylacetonates, or copper acetylacetonate. Useful metal halides can comprise titanium tetrachloride, or silicon tetrachloride. A surprising aspect of the disclosure is that the etching and the deposition can be performed simultaneously, that the etching by the second gaseous species does not also remove the deposition by the first gaseous species.

Plasma chemical vapor deposition (or plasma-enhanced chemical vapor deposition) is a process by which plasmas, typically generated by radio-frequency discharge, are formed in the space between two electrodes when that space is filled with a reacting gas or gases. Plasma chemical vapor deposition is done under vacuum to reduce side reactions from unwanted species being present in the reacting chamber. The reacting gas or gases typically deposit thin solid films on a substrate. In the provided method, the first gaseous species forms a layer on the substrate using plasma chemical vapor deposition simultaneously with the etching. In some embodiments, the etching results in a surface with areas of random depth in the direction normal to the original exposed surface. The provided method includes etching portions of the major surface to form a nanostructure on the substrate while simultaneously depositing a layer on the etched surface. Typically, reactive ion etching is used for the etching.

In one embodiment, the provided method can be carried out using a continuous roll-to-roll process referred to as "cylindrical reactive ion etching" (cylindrical RIE). Cylindrical RIE utilizes a rotating cylindrical electrode to provide etched nanostructures on the surface of a substrate or article. In many convenient embodiments, the etching results nanostructures etched to different depths from the original surface. In general, cylindrical RIE can be described as follows. A rotatable cylindrical electrode ("drum electrode") powered by radio-frequency (RF) and a grounded counter-electrode are provided inside a vacuum vessel. The counter-electrode can comprise the vacuum vessel itself. An etchant gas is fed into the vacuum vessel, and a plasma is ignited and sustained between the drum electrode and the grounded counter-electrode.

A continuous substrate comprising a random, discontinuous masking layer can then be wrapped around the circumference of the drum and the substrate can be etched in the direction normal to the plane of the substrate. The exposure time of the substrate can be controlled to obtain a predetermined etch depth of the resulting nanostructure. The process can be carried out at an operating pressure of approximately 10 mTorr. Cylindrical RIE is disclosed, for example, in PCT Pat. App. No. US2009/069662 (David et al.).

Figure 1B:
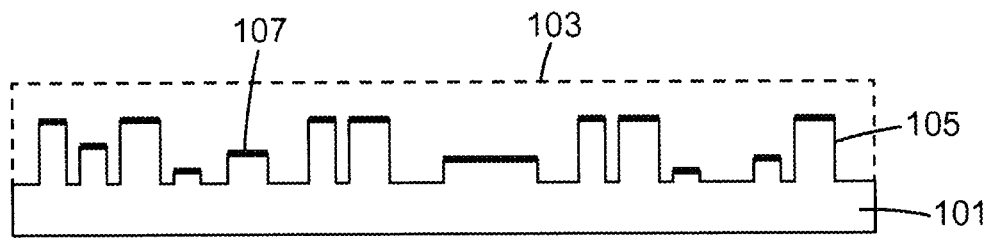

In another aspect, an article is provided that is made by the method described herein. FIGS. 1a and 1b are sequential schematic views of an embodiment of an article made by the provided method. FIG. 1a is a schematic illustration of substrate 101 having major surface 103. FIG. 1b is an illustration of the same article shown in FIG. 1a after having been treated with a plasma including the first and the second gaseous species. The second gaseous species has etched major surface 103 (the original surface shown in phantom), leaving microstructures 105 of diverse height and aspect ratio. At least portions of the etched surface 103 have a layer 107 deposited upon them via the first gaseous species, typically the highest parts of the nanostructures 105. In many convenient embodiments, the layer of the deposited species is present over all of the etched surface with a concentration that varies continuously according to the depth from the major surface 103.

Figure 2:
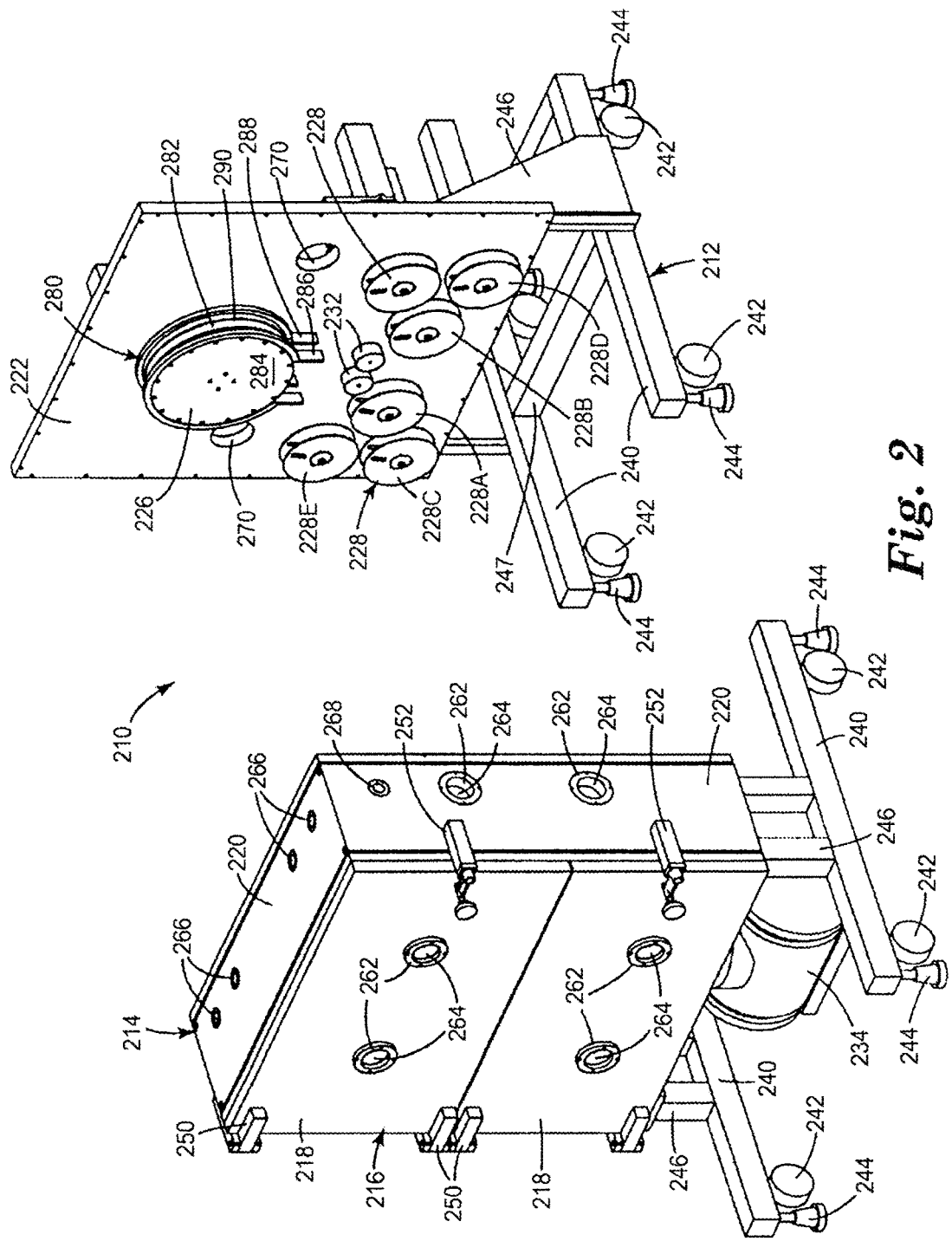
FIG. 2 is a first fragmentary perspective view of a coating apparatus useful in the present invention.
Figure 3:
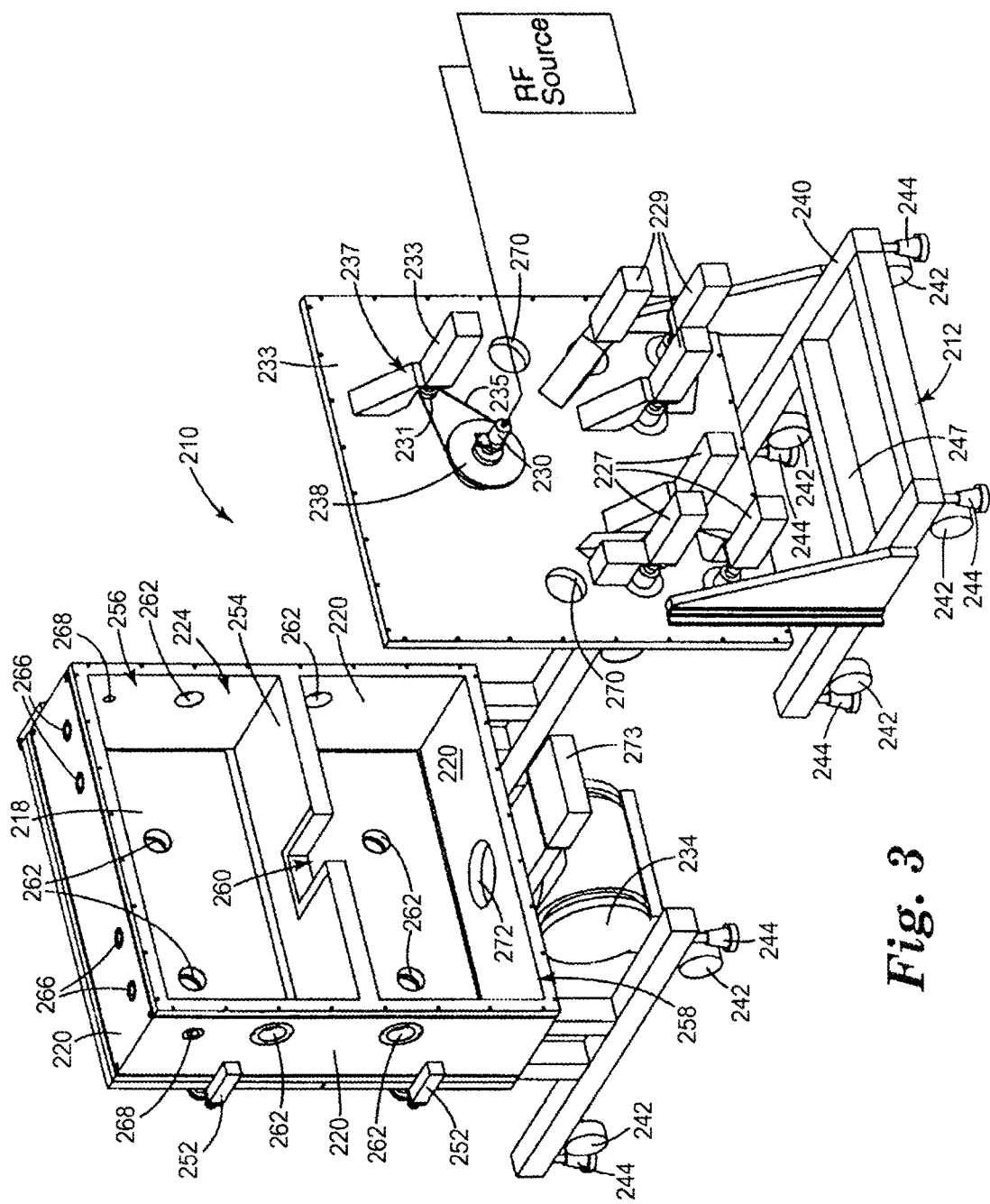
FIG. 3 is a second fragmentary perspective view of the apparatus of FIG. 1 taken from a different vantage point.

FIGS. 2 and 3 illustrate a cylindrical RIE apparatus that is useful for the method of the disclosure. A common element for plasma creation and ion acceleration is generally indicated as 210. This RIE apparatus 210 includes a support structure 212, a housing 214 including a front panel 216 of one or more doors 218, side walls 220 and a back plate 222 defining an inner chamber 224 therein divided into one or more compartments, a drum 226 rotatably affixed within the chamber, a plurality of reel mechanisms rotatably affixed within the chamber and referred to generally as 228, drive mechanism 237 for rotatably driving drum 226, idler rollers 232 rotatably affixed within the chamber, and vacuum pump 234 fluidly connected to the chamber.

Support structure 212 is any means known in the art for supporting housing 214 in a desired configuration, a vertically upright manner in the present case. As shown in FIGS. 2 and 3, housing 214 can be a two-part housing as described below in more detail. In this embodiment, support structure 212 includes cross supports 240 attached to each side of the two-part housing for supporting apparatus 210. Specifically, cross supports 240 include both wheels 242 and adjustable feet 244 for moving and supporting, respectively, apparatus 210. In the embodiment shown in FIGS. 2 and 3, cross supports 240 are attached to each side of housing 214 through attachment supports 246. Specifically, cross supports 240 are connected to one of side walls 220, namely the bottom side wall, via attachment supports 246, while cross supports 240 on the other side of housing 214 are connected to back plate 222 by attachment supports 246. An additional crossbar 247 is supplied between cross supports 240 on the right-hand side of apparatus 210 as shown in FIG. 2. This can provide additional structural reinforcement.

Housing 214 can be any means of providing a controlled environment that is capable of evacuation, containment of gas introduced after evacuation, plasma creation from the gas, ion acceleration, and etching. In the embodiment shown in FIGS. 2 and 3, housing 214 has outer walls that include front panel 216, four side walls 220, and a back plate 222. The outer walls define a box with a hollow interior, denoted as chamber 224. Side walls 220 and back plate 222 are fastened together, in any manner known in the art, to rigidly secure side walls 220 and back plate 222 to one another in a manner sufficient to allow for evacuation of chamber 224, containment of a fluid for plasma creation, plasma creation, ion acceleration, and etching. Front panel 216 is not fixedly secured so as to provide access to chamber 224 to load and unload substrate materials and to perform maintenance. Front panel 216 is divided into two plates connected via hinges 250 (or an equivalent connection means) to one of side walls 220 to define a pair of doors 218. These doors seal to the edge of side walls 220, preferably through the use of a vacuum seal (for example, an O-ring). Locking mechanisms 252 selectively secure doors 218 to side walls 220 and can be any mechanism capable of doors 218 to walls 220 in a manner allowing for evacuation of chamber 224, storage of a fluid for plasma creation, plasma creation, ion acceleration, and etching.

In one embodiment, chamber 224 is divided by a divider wall 254 into two compartments 256 and 258. A passage or hole 260 in wall 254 provides for passage of fluids or substrate between compartments. Alternatively, the chamber can be only one compartment or three or more compartments. Preferably, the chamber is only one compartment.

Housing 214 includes a plurality of view ports 262 with high pressure, clear (co)polymeric plates 264 sealably covering ports 262 to allow for viewing of the etching process occurring therein. Housing 214 also includes a plurality of sensor ports 266 in which various sensors (for example, temperature, pressure, etc.) can be secured. Housing 214 further includes inlet ports 268 providing for conduit connection through which fluid can be introduced into chamber 224 as needed. Housing 214 also includes pump ports 270 and 272 that allow gases and liquids to be pumped or otherwise evacuated from chamber 224.

Pump 234 is shown suspended from one of sides 220, typically the bottom (as shown in FIG. 3). Pump 234 can be, for example, a turbo-molecular pump fluidly connected to the controlled environment within housing 214. Other pumps, such as diffusion pumps or cryopumps, can be used to evacuate lower chamber 258 and to maintain operating pressure therein. The process pressure during the etching step is preferably chosen to be between about 1 mTorr and about 20 mTorr (more preferably, between about 5 mTorr and about 10 mTorr) to provide anisotropic etching. Sliding valve 273 is positioned along this fluid connection and can selectively intersect or block fluid communication between pump 234 and the interior of housing 214. Sliding valve 273 is movable over pump port 262 so that pump port 262 can be fully open, partially open, or closed with respect to fluid communication with pump 234.

Drum 226 typically is a cylindrical electrode 280 with an annular surface 282 and two planar end surfaces 284. The electrode can be made of any electrically conductive material and preferably is a metal such as, for example, aluminum, copper, steel, stainless steel, silver, chromium or an alloy of any one or more of the foregoing. Preferably, the electrode is aluminum, because of the ease of fabrication, low sputter yield, and low costs.

Drum 226 is further constructed to include non-coated, conductive regions that allow an electric field to permeate outward as well as non-conductive, insulative regions for preventing electric field permeation and thus for limiting film coating to the non-insulated or conductive portions of the electrode. The electrically non-conductive material typically is an insulator, such as a (co)polymer (for example, polytetrafluoroethylene). Various embodiments that fulfill this electrically non-conductive purpose so as to provide only a small channel, typically the width of the substrate to be coated, as a conductive area can be envisioned by one of ordinary skill in the art.

FIG. 2 shows an embodiment of drum 226 where annular surface 282 and end surfaces 284 of drum 226 are coated with an electrically non-conductive or insulative material, except for annular channel 290 in annular surface 282 which remains uncoated and thus electrically conductive. In addition, a pair of dark space shields 286 and 288 cover the insulative material on annular surface 282, and, in some embodiments, cover end surfaces 284. The insulative material limits the surface area of the electrode along which plasma creation and negative biasing may occur. However, since the insulative materials sometimes can become fouled by the ion bombardment, dark space shields 286 and 288 can cover part or all of the insulated material. These dark space shields may be made from a metal such as aluminum but do not act as conductive agents because they are separated from the electrode by means of an insulating material (not shown). This allows confinement of the plasma to the electrode area.

Figure 4A:
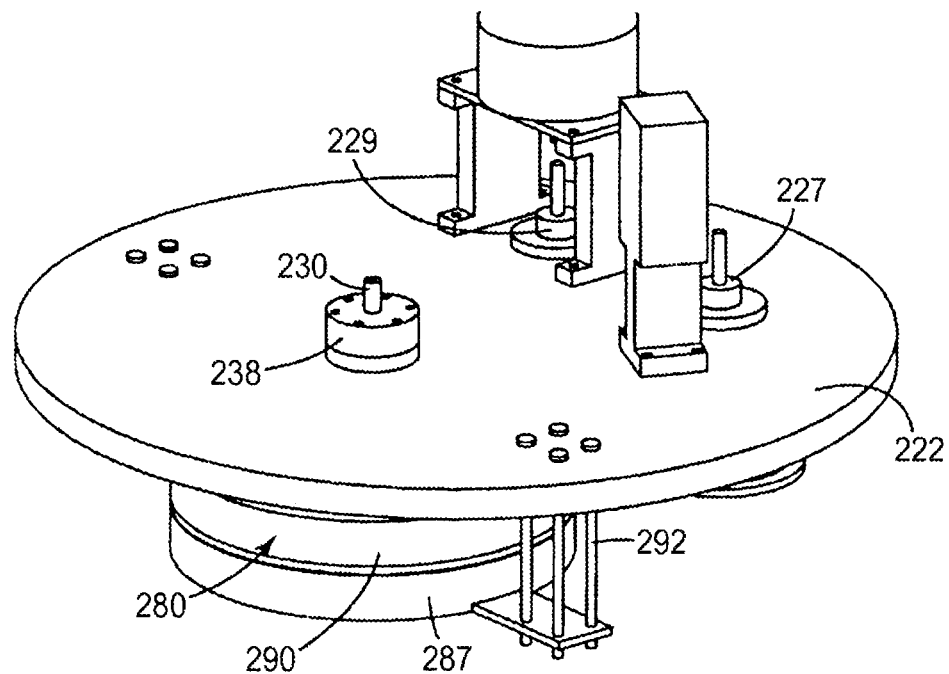
FIG. 4a is a fragmentary perspective view of another embodiment of the coating apparatus removed from its gas containing chamber.
Figure 4B:
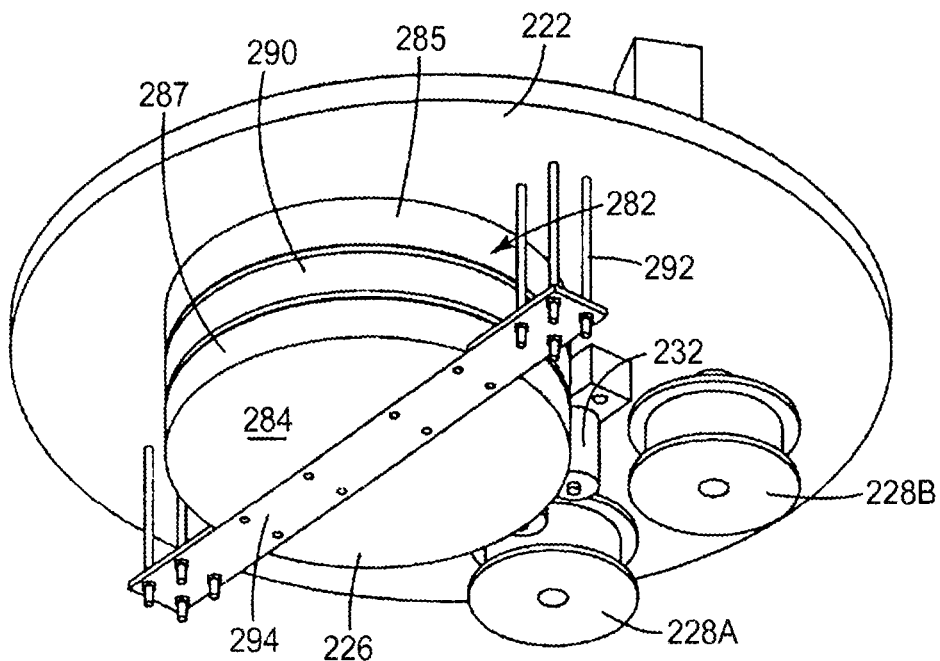
FIG. 4b is a second perspective view of the apparatus of FIG. 4a taken from a different vantage point.

Another embodiment of drum 226 is shown in FIGS. 4A and 4B where drum 226 includes a pair of insulative rings 285 and 287 affixed to annular surface 282 of drum 226. In some embodiments, insulative ring 287 is a cap which acts to also cover end surface 284. Bolts 292 secure support means 294, embodied as a flat plate or strap, to back plate 222. Bolts 292 and support means 294 can assist in supporting the various parts of drum 226. The pair of insulative rings 285 and 287, once affixed to annular surface 282, define an exposed electrode portion embodied as channel 290.

In any case, electrode 280 is covered in some manner by an insulative material in all areas except where the substrate contacts the electrode (that is, touching or within the plasma dark space limit of the electrode (for example, about 3 mm)). This defines an exposed electrode portion that can be in intimate contact with the substrate. The remainder of the electrode is covered by an insulative material. When the electrode is powered and the electrode becomes negatively biased with respect to the resultant plasma, this relatively thick insulative material prevents etching on the surfaces it covers. As a result, etching is limited to the uncovered area (that is, that which is not covered with insulative material, channel 290), which preferably is covered by relatively thin substrate material.

Referring to FIGS. 2 and 3, drum 226 is rotatably affixed to back plate 222 through a ferrofluidic feedthrough and rotary union 238 (or an equivalent mechanism) affixed within a hole in back plate 222. The ferrofluidic feedthrough and rotary union provide separate fluid and electrical connection from a standard coolant fluid conduit and electrical wire to hollow coolant passages and the conductive electrode, respectively, of rotatable drum 226 during rotation while retaining a vacuum seal. The rotary union also supplies the necessary force to rotate the drum, which force is supplied from any drive means such as a brushless DC servo motor. However, connection of drum 226 to back plate 222 and the conduit and wire may be performed by any means capable of supplying such a connection and is not limited to a ferrofluidic feedthrough and a rotary union. One example of such a ferrofluidic feedthrough and rotary union is a two-inch (about 5 cm) inner diameter hollow shaft feedthrough made by Ferrofluidics Co. (Nashua, N.H.).

Drum 226 is rotatably driven by drive mechanism 237, which can be any mechanical and/or electrical system capable of translating rotational motion to drum 226. In the embodiment shown in FIG. 3, drive mechanism 237 includes motor 233 with a drive shaft terminating in drive pulley 231 that is mechanically connected to a driven pulley 239 rigidly connected to drum 226. Belt 235 (or equivalent structure) translates rotational motion from drive pulley 231 to driven pulley 239.

The plurality of reel mechanisms 228 are rotatably affixed to back plate 222. The plurality of reel mechanisms 228 includes a substrate reel mechanism with a pair of substrate spools 228A and 228B, and, in some embodiments, also can include a spacing web reel mechanism with a pair of spacing web spools 228C and 228D, and masking web reel mechanism with a pair of masking web spools 228E and 228F, where each pair includes one delivery and one take-up spool. As is apparent from FIG. 3, at least each take-up spool 228B, 228D, and 228F includes a drive mechanism 227 mechanically connected thereto such as a standard motor as described below for supplying a rotational force that selectively rotates the reel as needed during etching. In addition, each spool 228A, 228C, and 228E in select embodiments includes a tensioner for supplying tautness to the webs and/or a drive mechanism 229.

Each reel mechanism includes a delivery and a take-up spool which may be in the same or a different compartment from each other, which in turn may or may not be the same compartment the electrode is in. Each spool is of a standard construction with an axial rod and a rim radially extending from each end defining a groove in which an elongated member, in this case a substrate or web, is wrapped or wound. Each spool is securably affixed to a rotatable stem sealably extending through back plate 222. In the case of spools to be driven, the stem is mechanically connected to a motor 227 (for example, a brushless DC servo motor). In the case of non-driven spools, the spool is merely coupled in a rotatable manner through a coupling 229 to back plate 222 and may include a tension mechanism to prevent slack.

RIE apparatus 210 also includes idler rollers 232 rotatably affixed within the chamber and pump 234 fluidly connected to the chamber. The idler rollers guide the substrate from the substrate spool 228A to channel 290 on drum 226 and from channel 290 to take-up substrate spool 228B. In addition, where spacing webs and masking webs are used, idler rollers 232 guide these webs and the substrate from substrate spool 228A and masking web spool 228E to channel 290 and from channel 290 to take-up substrate spool 228B and take-up masking web spool 228F, respectively.

RIE apparatus 210 further includes a temperature control system for supplying temperature controlling fluid to electrode 280 via ferrofluidic feedthrough 238. The temperature control system may be provided on apparatus 210 or alternatively may be provided from a separate system and pumped to apparatus 210 via conduits so long as the temperature control fluid is in fluid connection with passages within electrode 280. The temperature control system may heat or cool electrode 280 as is needed to supply an electrode of the proper temperature for etching. In a preferred embodiment, the temperature control system is a coolant system using a coolant such as, for example, water, ethylene glycol, chloro fluorocarbons, hydrofluoroethers, and liquefied gases (for example, liquid nitrogen).

RIE apparatus 210 also includes an evacuation pump fluidly connected to evacuation port(s) 270. This pump may be any vacuum pump, such as a Roots blower, a turbo molecular pump, a diffusion pump, or a cryopump, capable of evacuating the chamber. In addition, this pump may be assisted or backed up by a mechanical pump. The evacuation pump may be provided on apparatus 210 or alternatively may be provided as a separate system and fluidly connected to the chamber.

RIE apparatus 210 also includes a fluid feeder, preferably in the form of a mass flow controller that regulates the fluid used to create the thin film, the fluid being pumped into the chamber after evacuation thereof. The feeder may be provided on apparatus 210 or alternatively may be provided as a separate system and fluidly connected to the chamber. The feeder supplies fluid in the proper volumetric rate or mass flow rate to the chamber during etching. The etching gases can include, for example, oxygen, argon, chlorine, fluorine, carbon tetrafluoride, carbontetrachloride, perfluoromethane, perfluoroethane, perfluoropropane, nitrogen trifluoride, sulfur hexafluoride, methane, and the like. Mixtures of gases may be used advantageously to enhance the etching process.

Additional gases may be used for enhancing the etching rate of hydrocarbons or for the etching of non-hydrocarbon materials. For example, fluorine containing gases such as perfluoromethane, perfluoroethane, perfluoropropane, sulfurhexafluoride, nitrogen trifluoride, and the like can be added to oxygen or introduced by themselves to etch materials such as $SiO_2$, tungsten carbide, silicon nitride, amorphous silicon, and the like. Chlorine-containing gases can likewise be added for the etching of materials such as aluminum, sulfur, boron carbide, and the like. Hydrocarbon gases such as methane can be used for the etching of materials such as gallium arsenide, gallium, indium, and the like. Inert gases, particularly heavy gases such as argon can be added to enhance the anisotropic etching process.

RIE apparatus 210 also includes a power source electrically connected to electrode 280 via electrical terminal 230. The power source may be provided on apparatus 210 or alternatively may be provided on a separate system and electrically connected to the electrode via electrical terminal (as shown in FIG. 3). In any case, the power source is any power generation or transmission system capable of supplying sufficient power. (See discussion infra.)

Although a variety of power sources are possible, RF power is preferred. This is because the frequency is high enough to form a self bias on an appropriately configured powered electrode but not high enough to create standing waves in the resulting plasma. RF power is scalable for high output (wide webs or substrates, rapid web speed). When RF power is used, the negative bias on the electrode is a negative self bias, that is, no separate power source need be used to induce the negative bias on the electrode. Because RF power is preferred, the remainder of this discussion will focus exclusively thereon.

The RF power source powers electrode 280 with a frequency in the range of 0.01 to 50 MHz preferably 13.56 MHz or any whole number (for example, 1, 2, or 3) multiple thereof. This RF power as supplied to electrode 280 creates a plasma from the gas within the chamber. The RF power source can be an RF generator such as a 13.56 MHz oscillator connected to the electrode via a network that acts to match the impedance of the power supply with that of the transmission line (which is usually 50 ohms resistive) so as to effectively transmit RF power through a coaxial transmission line.

Upon application of RF power to the electrode, the plasma is established. In an 15 RF plasma the powered electrode becomes negatively biased relative to the plasma. This bias is generally in the range of 500 to 1400 volts. This biasing causes ions within the plasma to accelerate toward electrode 280. Accelerating ions etch the article in contact with electrode 280 as is described in more detail below.

In operation, a full spool of substrate upon which etching is desired is inserted over the stem as spool 228A. Access to these spools is provided through lower door 218 since, in FIGS. 2 and 3, the spools are located in lower compartment 258 while etching occurs in upper compartment 256. In addition, an empty spool is fastened opposite the substrate holding spool as spool 228B so as to function as the take-up spool after etching has occurred. If a spacer web is desired to cushion the substrate during winding or un-winding, spacer web delivery and/or take-up spool can be provided as spools 228C and 228D (although the location of the spools in the particular locations shown in the figures is not critical). Similarly, if etching is desired in a pattern or otherwise partial manner, a masking web can be positioned on an input spool as spool 228E and an empty spool is positioned as a take-up spool as spool 228F.

After all of the spools with and without substrates or webs are positioned, the substrate on which etching is to occur (and any masking web to travel therewith around the electrode) are woven or otherwise pulled through the system to the take-up reels. Spacer webs generally are not woven through the system and instead separate from the substrate just before this step and/or are provided just after this step. The substrate is specifically wrapped around electrode 280 in channel 290 thereby covering the exposed electrode portion. The substrate is sufficiently taut to remain in contact with the electrode and to move with the electrode as the electrode rotates so a length of substrate is always in contact with the electrode for etching. This allows the substrate to be etched in a continuous process from one end of a roll to the other. The substrate is in position for etching and lower door 218 is sealed closed.

Chamber 224 is evacuated to remove all air and other impurities. Once an etchant gas mixture is pumped into the evacuated chamber, the apparatus is ready to begin the process of etching. The RF power source is activated to provide an RF electric field to electrode 80. This RF electric field causes the gas to become ionized, resulting in the formation of a plasma with ions therein. This is specifically produced using a 13.56 MHz oscillator, although other RF sources and frequency ranges may be used. The power density of the RF power of the etching process is preferably in the range of about 0.1 to about 1.0 watts/cm$^3$ (preferably, about 0.2 to about 0.4 watts/cm$^3$).

Once the plasma has been created, a negative DC bias voltage is created on electrode 280 by continuing to power the electrode with RF power. This bias causes ions to accelerate toward annular channel 290 of electrode 280 (the remainder of the electrode is either insulated or shielded). The ions selectively etch the substrate material (versus the mask material) in the length of substrate in contact with channel 290 of electrode 280 causing anisotropic etching of the substrate material on that length of substrate.

For continuous etching, the take-up spools are driven so as to pull the substrate and any masking webs through the upper compartment 254 and over electrode 280 so that etching of the matrix occurs on any unmasked substrate portions in contact with annular channel 290. The substrate is thus pulled through the upper compartment continuously while a continuous RF field is placed on the electrode and sufficient reactive gas is present within the chamber. The result is a continuous etching on an elongated substrate, and substantially only on the substrate. Etching does not occur on the insulated portions of the electrode nor does etching occur elsewhere in the chamber. To prevent the active power fed to the plasma from being dissipated in the end plates of the cylindrical electrode, grounded dark space shields 286 and 288 can be used. Dark space shields 286 and 288 can be of any shape, size, and material that is conducive to the reduction of potential fouling. In the embodiment shown in FIGS. 2 and 3, dark space shields 286 and 288 are metal rings that fit over drum 226 and the insulation thereon. Dark space shields 286 and 288 do not bias due to the insulating material that covers drum 226 in the areas where dark space shields 286 and 288 contact drum 226. The dark space shields in this ring-like embodiment further include tabs on each end thereof extending away from drum 226 in a non-annular manner. These tabs can assist in aligning the substrate within channel 290.

Typically, the temperature control system pumps fluid through electrode 280 throughout the process to keep the electrode at a desired temperature. Typically, this involves cooling the electrode with a coolant as described above, although heating in some cases may be desirable. In addition, since the substrate is in direct contact with the electrode, heat transfer from the plasma to the substrate is managed through this cooling system, thereby allowing the coating of temperature sensitive films such as polyethyleneterephthalate, polyethylene naphthalate, and the like. After completion of the etching process, the spools can be removed from shafts supporting them on the wall. The nanostructured substrate is on spool 228B and is ready for use.

The surface of the substrate, itself, may be microstructured. For example, a thin, random, discontinuous masking layer can be applied to a major surface of a substrate with a v-groove microstructured surface by plasma chemical vapor deposition to form nanostructures on v-groove microstructured surface. Alternatively, a microstructured article such as Fresnel lens or a microstructured article comprising microreplicated posts or columns comprising nanodispersed phases can be also treated by plasma etching to form nanostructures on microstructures.

The nanostructured surface made by the method of the disclosure can have a nanostructured anisotropic surface. The nanostructured anisotropic surface typically can comprise nanoscale features having a height to width ratio or about 2:1 or greater, preferably about 5:1 or greater. In some embodiments, the height to width ratio can even be 50:1 or greater, 100:1 or greater, or 200:1 or greater. The nanostructured anisotropic surface can comprise nanofeatures such as, for example, nano-pillars or nano-columns, or continuous nano-walls comprising nano-pillars or nano-columns. Typically, the nanofeatures have steep side walls that are substantially perpendicular to the substrate.

In some embodiments, the majority of the nanofeatures can be capped with mask material. The concentration of the mask material at the surface can be from about 5 weight % to about 90 weight % or from about 10 weight % to about 75 weight %.

In certain embodiments, the substrate may comprise materials for static dissipation in order to minimize attraction of dirt and particulate and thus maintain surface quality. Suitable materials for static dissipation include, for example, STAT-RITE polymers such X-5091, M-809, S-5530, S-400, S-403, and S-680 (available from Lubrizol, Wickliffe, Ohio); 3,4-polyethylenedioxythiophene-polystyrenesulfonate (PEDOT/PSS) (available from H.C. Starck, Cincinnati, Ohio); polyanaline; polythiophene; and PELESTAT NC6321 and NC7530 antistatic additives (available from Tomen America Inc., New York, N.Y.).

The nanostructured articles made by the provided method can exhibit one or more desirable properties such as antireflective properties, light absorbing properties, antifogging properties, improved adhesion and durability. For example, in some embodiments, the surface reflectivity of the nanostructured anisotropic surface is about 50% or less than the surface reflectivity of an untreated surface. As used herein with respect to comparison of surface properties, the term "untreated surface" means the surface of an article comprising the same matrix material and the same nanodispersed phase (as the nanostructured surface of the disclosure to which it is being compared) but without a nanostructured anisotropic surface. In some embodiments, the percent reflection of the nanostructured anisotropic surface can be less than about 2% (typically, less than about 1%) as measured using the "Measurement of Average % Reflection" method described in the Example section below. Likewise, in some embodiments, the percent transmission of the nanostructured anisotropic surface can be about 2% or more than the percent transmission of an untreated surface as measured using the "Measurement of Average % Transmission" method described in the Example section below.

In other embodiments, the nanostructured anisotropic surface can have a water contact angle of less than about 20°, less than about 15°, or even less than about 10° as measured using the "Water Contact Angle Measurement" method described in the Example section below. In still other embodiments, the nanostructured anisotropic surface can absorb about 2% or more light than an untreated surface. In yet other embodiments of the disclosure, the nanostructured anisotropic surface can have a pencil hardness greater than about 2H (typically, greater than about 4H) as determined according to ASTM D-3363-05. In other embodiments, an article is provided that can be made in a continuous manner by the provided method so that the percentage of light (measured at 450 nm) transmitted through the localized nanostructured surface that is deflected more than 2.5 degrees from the direction of incoming beam is less than 2.0%, typically less than 1.0%, and more typically less than 0.5%.

Some embodiments of the disclosure further comprise a layer or coating comprising, for example, ink, encapsulant, adhesive, or metal attached to the nanostructured anisotropic surface. The layer or coating can have improved adhesion to the nanostructured anisotropic surface of the disclosure than to an untreated surface.

The nanostructured articles made by the method of the disclosure are useful for numerous applications including, for example, display applications (for example, liquid crystal displays (LCD), light emitting diode (LED) displays, or plasma displays); light extraction; electromagnetic interference (EMI) shielding, ophthalmic lenses; face shielding lenses or films; window films; antireflection for construction applications, construction applications or traffic signs; and the like. The nanostructured articles are also useful for solar applications such as solar films and Fresnel lenses. They can be used as the front surface and/or secondary surface of solar thermal hot liquid/air heat panels or any solar energy absorbing device; for solar thermal absorbing surfaces having micro- or macro-columns with additional nanoscale surface structure; for the front surface of flexible solar photovoltaic cells made with amorphous silica photovoltaic cells or CIGS photovoltaic cells; and for the front surface of a film applied on top of flexible photovoltaic cells.

In another embodiment of the disclosure, the mask material dispersed on the substrate can be etched away using plasma to form a nanostructured (or nanoporous) surface. This method can be carried out using cylindrical RIE essentially as described above, but using etching selectivity to favor etching the dispersed material rather than the substrate (that is, by selecting gases that etch dispersed phase material rather than the substrate material).

Figure 9:
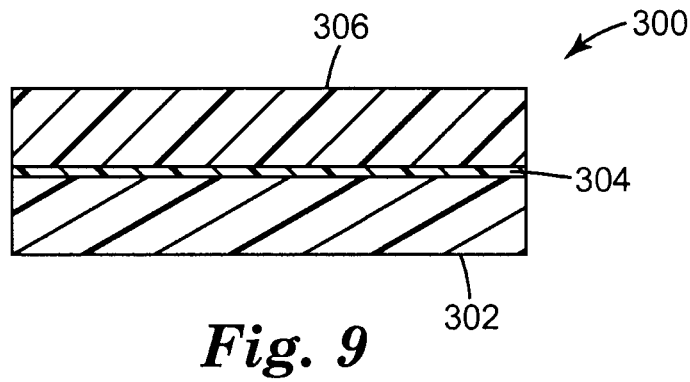
FIG. 9 is a cross section view of a multilayered laminate including a fluoropolymer substrate provided with a nanostructure, joined with another film.

Fluoropolymeric substrates are notoriously difficult to join to adjacent layers by, e.g. adhering, laminating, and compression molding. Film forming materials coated onto such substrates are also show unusually low attachment. Common expedients for increasing attachment to substrates, such as flame or corona treatment, are typically ineffective when applied to fluoropolymeric substrates. It has been found that providing fluoropolymeric substrates with a least one nanostructured surface formed via the techniques of this disclosure allow much greater attachment of adjacent layers. Referring now to FIG. 9, a side view of a multilayered laminate 300 including a fluoropolymer substrate 302 provided with a nanostructure 304, joined with an adjacent film 306. Laminates such as the one illustrated can be obtained by, e.g., laminating the nanostructured surface with a film, by compression molding a film against the nanostructured surface, and by coating a film-forming material onto the nanostructured surface. Of particular interest, useful laminates can include pressure sensitive adhesives contacting the nanostructured surface. For example, useful laminates may be obtained by application of a pressure sensitive adhesive composition from a transfer liner at room temperature without any other pretreatment. Additionally, they can be obtained by extrusion coating of hot melt adhesives, solvent coating of solvent-borne adhesives, or slot coating of liquid adhesives. This is not possible with the traditional treatment methods for fluoropolymer films.

Preferred fluoropolymers include PTFE polymers such as S-PTFE and E-PTFE. They also include fluorothermoplastics such as ECTFE, EFEP, ETFE, FEP, HTE, PCTFE, PFA, PVF, PVDF, THV, and Teflon® AF polymers. Also included are fluoroelastomers such as FKM, PFE, and LTFE.

Figure 10:
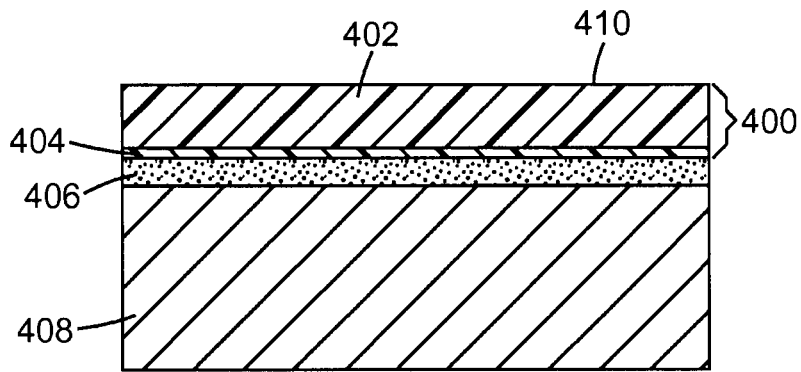
FIG. 10 is a cross section view of a multilayered laminate including a fluoropolymer substrate provided with a nanostructure, joined with an adhesive layer, the adhesive layer in turn adhered to a surface to be protected.

Referring now to FIG. 10, a cross section view of a multilayered laminate 400, including a fluoropolymer substrate 402 provided with a nanostructure 404, joined with an adhesive layer 406 is illustrated. Adhesive layer 406 is in turn adhered to one surface of a material 408 needing to be protected. Since in the illustrated embodiment the exterior facing surface 410 of fluoropolymer substrate 402 has not been provided with a nanostructure, it retains its chemical and adhesion resistance. If the adhesive layer 406 is a pressure sensitive adhesive, multilayered laminate 400 could be suited for use as, e.g. a graffiti protection film for architectural use. Alternatively, if the adhesive layer 406 is an epoxy adhesive, multilayered laminate 400 could be suited for use as, e.g. a protective laminate for the inside of a chemical reactor. Alternatively, if the adhesive layer 406 is an optically clear adhesive with a UV absorbing quality, multilayered laminate 400 could be suited for use as, e.g. a solar film useful for window film or protecting photovoltaic cells. In some embodiments where photovoltaic cells are to be protected an encapsulant layer such as EVA may be positioned against the nanostructured surface, or interposed between the photovoltaic cell and an adhesive layer positioned against the nanostructured surface.

Figure 11:
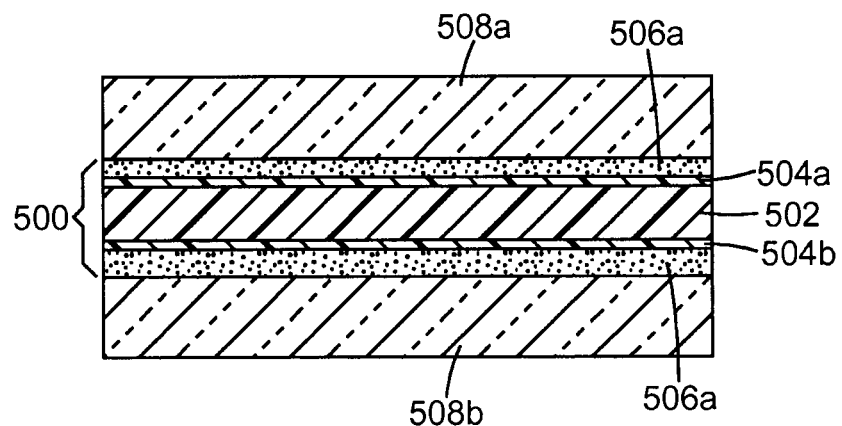
FIG. 11 is a cross section view of a multilayered laminate including a fluoropolymer substrate provided with a nanostructure on each of two major surfaces, each of the nanostructures joined with an adhesive layer, each adhesive layer in turn adhered to a surface to form an article.

Referring now to FIG. 11, a cross section view of a multilayered laminate 500 including a fluoropolymer substrate 502 provided with a nanostructure 504a and 504b on each of two major surfaces, each of the nanostructures 504a and 504b joined with an adhesive layer 506a and 506b, each adhesive layer 506a and 506b in turn adhered to one surface of a materials 508a and 508b needing to be joined. If for example materials 508a and 508b are glass, the combined structure could be well suited as a glazing laminate.

The operation of various embodiments of the present disclosure will be further described with regard to the following detailed Examples.

Examples

These Examples are merely for illustrative purposes and are not meant to be overly limiting on the scope of the appended claims. Notwithstanding that the numerical ranges and parameters setting forth the broad scope of the present disclosure are approximations, the numerical values set forth in the specific examples are reported as precisely as possible. Any numerical value, however, inherently contains certain errors necessarily resulting from the standard deviation found in their respective testing measurements. At the very least, and not as an attempt to limit the application of the doctrine of equivalents to the scope of the claims, each numerical parameter should at least be construed in light of the number of reported significant digits and by applying ordinary rounding techniques.

Unless otherwise noted, all parts, percentages, ratios, etc. in the Examples and the rest of the specification are provided on the basis of weight. Solvents and other reagents used may be obtained from Sigma-Aldrich Chemical Company (Milwaukee, Wis.) unless otherwise noted.

The provided nanostructures and methods described herein were obtained by using a homebuilt plasma treatment system described in detail in U.S. Pat. No. 5,888,594 (David et al.) with some modifications and is illustrated in FIGS. 2, 3, and 4a and 4b. The width of the drum electrode was increased to 42.5 inches (108 cm) and the separation between the two compartments within the plasma system was removed so that all the pumping was carried out by means of the turbo-molecular pump and thus operating at a much lower operating pressure than is conventionally done with plasma processing.

Measurement of Reflectance (Average Reflection %)

The Reflectance (Average Reflection % or % R) of the plasma treated surface was measured using BYK Gardiner color guide sphere. One sample of each film was prepared by applying Yamato Black Vinyl Tape #200-38 (obtained from Yamato International Corporation, Woodhaven, Mich.) to the backside of the sample. A Clear glass slide of which transmission and reflection from both sides were predetermined was utilized to establish the % reflection from the black tape. The black tape was laminated to the backside of the sample using a roller to ensure there were no air bubbles trapped between the black tape and the sample. To measure the front surface total Reflectance (% R, specular and diffuse) by an integrating sphere detector, the sample was placed in the machine so that the non-tape side was against the aperture. The Reflectance (% R) was measured at a 10° incident angle and average Reflectance (% R) was calculated by subtracting the Reflectance (% R) of the black tape for the wavelength range of 400-700 nm.

Measurement of Haze and Transmission

Measurement of Haze and Transmission was carried out with BYK Haze Delta-Gard Plus (from BYK Gardiner, Columbia, Md.) according to ASTM D1003 & D1004.

Measurement of Weathering 3-1 Weathering

The test panels with the adhered films were exposed to the following conditions per ASTM G155, Cycle 1: Duration 2000 hours, Xenon Arc Lamp @ 0.35 W/m$^2$/nm @340 nm, alternate cycles of 102 minutes Xenon Arc light at 63° C. Black Panel Temperature and 18 minutes of combination of Xenon Arc light and DI water spray, with uncontrolled air temperatures.

4-1 Weathering

The test panels with the adhered films were exposed to the following conditions per ASTM G154, Cycle 2: Duration 2000 hours, UVB-313 Fluorescent UV Lamp @0.71 W/m$^2$/nm @ 310 nm, alternate cycles of 4 hours UV at 60° C. Black Panel Temperature with 4 hours condensation at 50° C. Black Panel Temperature.

Example 1—Nanostructure Formed on PTFE Substrate Film

A roll of extruded 50 micron thick polytetrafluoroethylene (PTFE) film was formed by combining a fine powder of emulsion PTFE resin DYNEON TF-2071" of St. with an extrusion lubricant commercially available as "ISOPAR M" from Exxon Mobil of Irving, Tex., according to the recommended weight percentage for the lubricant. These ingredients were mixed into a paste, and this paste was extruded into a film. This film was calendered to a specific film thickness using a series of calendar rolls. The sized film was then run through an extractor where the lubricant was removed. Finally, the green film was run through a sintering process in a high temperature oven to fuse the film and bring it to the final thickness.

Figure 5:
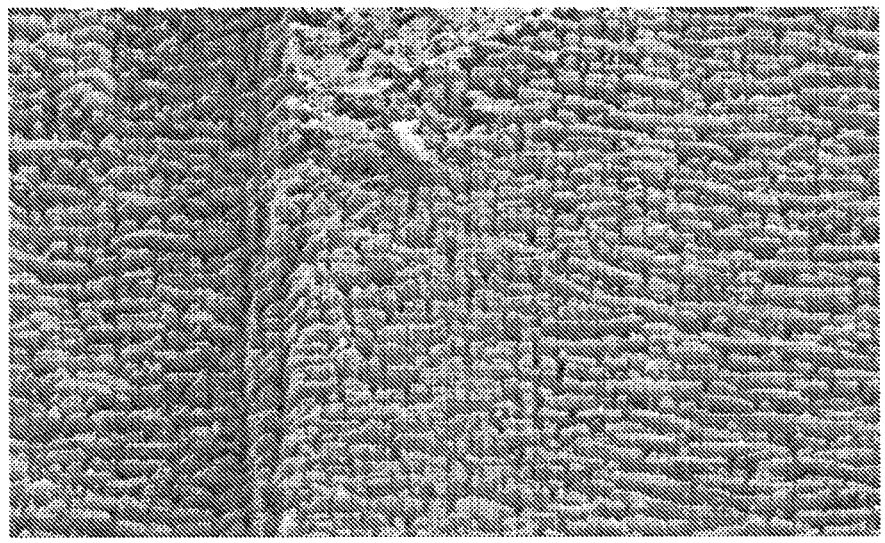
FIG. 5 is a micrograph of the surface of a film etched according to Example 1 below.

This PTFE film was mounted within the chamber, the film wrapped around the drum electrode, and secured to the take up roll on the opposite side of the drum. The un-wind and take-up tensions were maintained at 3 pounds (13.3 N). The chamber door was closed and the chamber pumped down to a base pressure of $5 \times 10^{-4}$ Torr. The first gaseous species was tetramethylsilane gas provided at a flow rate of 40 sccm and the second gaseous species was oxygen provided at a flow rate of 500 sccm. The pressure during the exposure was around 10 mTorr and plasma was turned on at a power of 6000 watts while the tape was advanced at a speed of 6 ft/min (1.83 m/min). The surface morphology of the PTFE films of was determined by SEM analysis and the results are shown in FIG. 5.

Further, an adhesive tape was formed by coating a 0.0017 inch (0.043 mm) thick layer of silicone pressure sensitive adhesive on the sintered film. The specific silicone adhesive was the one used with the PTFE tape commercially available as "5490 PTFE tape" from 3M Company of Saint Paul, Minn.

As a control to test the adhesion of this adhesive tape, a control tape was made by using the same fused film discussed above, and the same silicone adhesive, but instead of using a plasma treatment according to the disclosure and the protocol above, the fused film was subjected to a traditional chemical etch using sodium naphthalate commercially available from Acton Technologies of Pittston, Pa. Both the experimental example and the control were subjected to a 90° peel test from stainless steel, and both showed a peel strength of 20 oz/in (2.19 N/cm), showing that the film of Example 1 is practical for use in adhesive tapes.

To learn whether this good adhesion could persist in the face of weathering, the adhesive tape made according the example was exposed to conditions simulative of weathering. In this case, the control was PTFE tape commercially available as "5490 PTFE tape" from 3M Company. Test panels were prepared by adhering the Example adhesive tape and the control adhesive tape to stainless steel panels. The steel panels were then exposed to 2000 hours of weathering generally following the procedures of ASTM G155. More specifically, there were alternate cycles of 102 minutes with xenon arc light at 63° C. Black Panel Temperature and 18 minutes of combination of xenon arc light and DI water spray, with uncontrolled air temperatures. The xenon arc lamp employed provided 0.35 W/m²/nm at 340 nm. Adhesive strength and visual observation of any transfer of adhesive to the steel upon a 90° peel test was assessed after 200, 500, 1000, and finally 2000 hours. The results are presented in Table 1 below.

TABLE 1

| Example No. | Initial Adhesion to Steel (oz/in) | After 200 Hours | | After 500 Hours | | After 1000 Hours | | After 2000 Hours | |
|---|---|---|---|---|---|---|---|---|---|
| | | Adhesion to Steel (oz/in) Avg. | Transfer (%) Avg. | Adhesion to Steel (oz/in) Avg. | Transfer (%) Avg. | Adhesion to Steel (oz/in) Avg. | Transfer (%) Avg. | Adhesion to Steel (oz/in) Avg. | Transfer (%) Avg. |
| Example 1 | 32 | 58 | 10[1] | 56 | 50[1] | 61 | 50[1] | 56 | 10[1] |
| Control | 29 | 28 | 100[3] | 33 | 95[3] | 29 | 100[3] | 26 | 100[3] |

[1] Cohesive transfer
[2] Adhesive residue, some edge transfer of adhesive, and panel discoloration/ghosting
[3] 100% transfer of adhesive to stainless steel panel with complete breakdown of bond strength between primer and PTFE film Example 2—Nanostructure Formed on PET Substrate Film A roll of 125 micron thick polyethylene phthalate (PET) film was mounted within the chamber, the film wrapped film rapped around the drum electrode, and secured to the take up roll on the opposite side of the drum. The un-wind and take-up tensions were maintained at 3 pounds (13.3 N). The chamber door was closed and the chamber pumped down to a base pressure of $5 \times 10^{-4}$ Torr. The first gaseous species was hexamethyldisiloxane (HMDSO) vapor provided at three different flow rates as outlined in Table 1 below, and the second gaseous species was oxygen provided at a flow rate of 500 sccm. The pressure during the exposure was around 10 mTorr and plasma was turned on at a power of 6000 watts.

The film was advanced at diverse line speeds as outlined in Table 2 below. The Reflectance (% R) of the tape was measured according to the protocol above at each process condition at three locations: the left edge of the tape, the right edge of the tape, and the center. Average values were also calculated and presented in Table 2. Then the film was adhered to adhesive tape having an acrylic pressure sensitive adhesive, commercially available as "MAGIC" Tape 810 from 3M Company, St. Paul, Minn. The values resulting from a 90° peel test are also presented in Table 2 in terms of oz/in.

TABLE 2

| | Conditions | | Reflectance (%) | | | | Adhesion 90° Peel (oz/in) | | | |
|---|---|---|---|---|---|---|---|---|---|---|
| Example No. | HMDSO Flow rate (sccm) | Line speed (fpm) | left | center | right | average | left | center | right | average |
| 2-1 | 10 | 4 | 4.05 | 3.11 | 3.51 | 3.56 | 4 | 4 | 4 | 4 |
| 2-2 | 10 | 6 | 5.00 | 3.79 | 3.45 | 4.08 | 4 | 4 | 4 | 4 |

TABLE 2-continued

| Example No. | Conditions HMDSO Flow rate (sccm) | Line speed (fpm) | Reflectance (%) left | center | right | average | Adhesion 90° Peel (oz/in) left | center | right | average |
|---|---|---|---|---|---|---|---|---|---|---|
| 2-3 | 10 | 8 | 5.87 | 5.07 | 4.61 | 5.18 | 3 | 4 | 5 | 4 |
| 2-4 | 20 | 4 | 1.48 | 2.15 | 2.65 | 2.09 | 5 | 5 | 5 | 5 |
| 2-5 | 20 | 6 | 1.96 | 1.07 | 1.23 | 1.42 | 5 | 5 | 5 | 5 |
| 2-6 | 20 | 8 | 3.82 | 2.67 | 2.12 | 2.87 | 4 | 4 | 4 | 4 |
| 2-7 | 30 | 4 | 1.37 | 2.37 | 2.50 | 2.08 | 5 | 4 | 4 | 4.3 |
| 2-8 | 30 | 6 | 2.05 | 2.58 | 1.97 | 2.20 | 5 | 5 | 5 | 5 |
| 2-9 | 30 | 8 | 3.19 | 3.52 | 2.38 | 3.03 | 4 | 4 | 4 | 3.7 |

Example 3—Nanostructure Formed on TAC Substrate Film

A roll of film commercially available as 80 micrometer thick cellulose triacetate film, commercially available as "IPI TAC" (obtained from Island Pyrochemical Industries Corp, Mineola, N.Y., under the trade designation "IPI TAC") was mounted within the chamber, the film wrapped around the drum electrode, and secured to the take up roll on the opposite side of the drum using adhesive tape. The un-wind and take-up tensions were maintained at 3 pounds (13.3 N). The chamber door was closed and the chamber pumped down to a base pressure of $5 \times 10^{-4}$ Torr.

The first gaseous species was hexamethyldisiloxane (HMDSO) vapor provided at three different flow rates as outlined in Table 2 below, and the second gaseous species was oxygen provided at a flow rate of 500 sccm. The pressure during the exposure was around 10 mTorr and plasma was turned on at a power of 6000 watts. The tape was advanced at diverse line speeds as outlined in Table 3 below. The Reflectance (% R) of the tape was measured according to the protocol above at each process condition at three locations: the left edge of the tape, the right edge of the tape, and the center. Average values were also calculated and presented in Table 3. Then the film was adhered to adhesive tape having an acrylic pressure sensitive adhesive, commercially available as "MAGIC" Tape 810 from 3M Company. The values resulting from a 90° peel test are also presented in Table 3 in terms of oz/in.

TABLE 3

| Example No. | Run Conditions HMDSO Flowrate (sccm) | Line Speed (fpm) | Reflectance (%) Left | Center | Right | Average | Adhesion 90° Peel (oz/in) |
|---|---|---|---|---|---|---|---|
| 3-1 | 10 | 6 | 1.71 | 1.64 | 2.11 | 1.82 | 5.0 |
| 3-2 | 10 | 8 | 1.13 | 1.13 | 1.08 | 1.11 | 5.0 |
| 3-3 | 10 | 10 | 1.05 | 0.94 | 1.09 | 1.03 | 4.0 |
| 3-4 | 20 | 8 | 2.10 | 1.97 | 1.86 | 1.98 | 5.0 |
| 3-5 | 20 | 10 | 1.54 | 1.51 | 1.48 | 1.51 | 4.0 |
| 3-6 | 20 | 12 | 1.77 | 1.77 | 1.74 | 1.76 | 4.0 |
| 3-7 | 30 | 8 | 4.23 | 4.38 | 4.39 | 4.33 | 0.0 |
| 3-8 | 30 | 10 | 4.36 | 4.09 | 4.23 | 4.23 | 1.0 |
| 3-9 | 30 | 12 | 4.00 | 4.35 | 4.31 | 4.22 | 1.0 |

Example 4—Nanostructure Formed on Upliex Polyimide Substrate Film

A roll of polyimide film commercially available as 12.5 micrometer thick polyimide films commercially available as "UPILEX-12.5S" from Ube Industries, of Tokyo, Japan, was mounted within the chamber, the tape wrapped around the drum electrode, and secured to the take up roll on the opposite side of the drum. The un-wind and take-up tensions were maintained at 3 pounds (13.3 N). The chamber door was closed and the chamber pumped down to a base pressure of $5 \times 10^{-4}$ Torr. The first gaseous species was hexamethyldisiloxane (HMDSO) vapor provided at three different flow rates as outlined in Table 4 below, and the second gaseous species was oxygen provided at a flow rate of 500 sccm. The pressure during the exposure was around 10 mTorr and plasma was turned on at a power of 6000 watts. The film was advanced at diverse line speeds as outlined in Table 4 below. The Optical Transmittance (% Transmission), Haze (% Haze), and the Reflectance (% Reflectance) was measured at each process condition. The values are presented in Table 4. A control in the form of completely untreated UPILEX film is also presented.

TABLE 4

| Sample No. | HMDSO Flowrate (sccm) | Oxygen Flowrate (sccm) | Line Speed (ft/min) | Transmission (%) | Haze Delta (%) | Reflectance (%) |
|---|---|---|---|---|---|---|
| Control | N/A | N/A | N/A | 69.7 | 1.8 | 9.7 |
| 4-1 | 20 | 500 | 6 | 70.8 | 1.56 | 8.35 |
| 4-2 | 30 | 500 | 6 | 72.2 | 1.48 | 5.45 |
| 4-3 | 40 | 500 | 6 | 73.5 | 1.44 | 3.47 |
| 4-4 | 20 | 500 | 8 | 69.8 | 1.69 | 8.49 |
| 4-5 | 30 | 500 | 8 | 70.9 | 1.64 | 6.73 |
| 4-6 | 40 | 500 | 8 | 71.6 | 1.51 | 5.18 |
| 4-7 | 20 | 500 | 19 | 69.1 | 1.65 | 9.14 |
| 4-8 | 30 | 500 | 10 | 70 | 1.61 | 7.79 |

Comparative Example 4C—Comparative Example (Nanostructure Formed on Upilex Polyimide Film by the Methods of WO2011/139593)

A roll of Upilex polyimide film as described above was mounted within the chamber, the tape wrapped around the drum electrode, and secured to the take up roll on the opposite side of the drum. The un-wind and take-up tensions were maintained at 3 pounds (13.3 N). The chamber door was closed and the chamber pumped down to a base pressure of $5 \times 10^{-4}$ Torr.

The polyimide film was plasma treated in two passes generally as disclosed in WO2011/139593. In the first pass, the first gaseous species was tetramethylsilane gas provided at a flow rate of 50 sccm and the second gaseous species was argon provided at a flow rate of 500 sccm. The pressure during the exposure was around 4 mTorr and plasma was turned on and maintained at a power of 600 watts while the film was advanced at a speed of 37 ft/min (11.3 m/min). In the second pass, only one gaseous species, oxygen was provided at a flow rate of 400 sccm. The pressure during the exposure was around 5 mTorr and plasma was turned on and maintained at a power of 5000 watts while the film was advanced at a speed of 10 ft/min (3.05 m/min).

Figure 6:
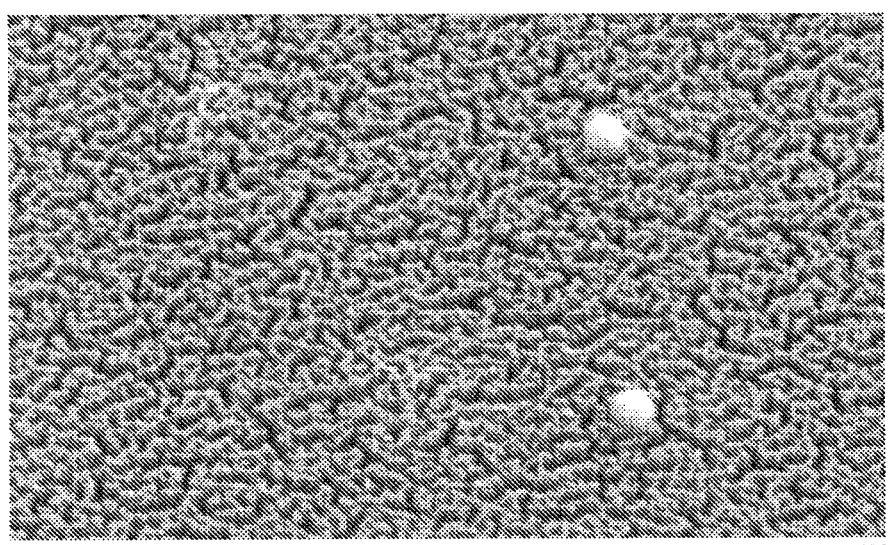
FIG. 6 is a micrograph of the surface of a film etched according to Example 4 below.
Figure 7:
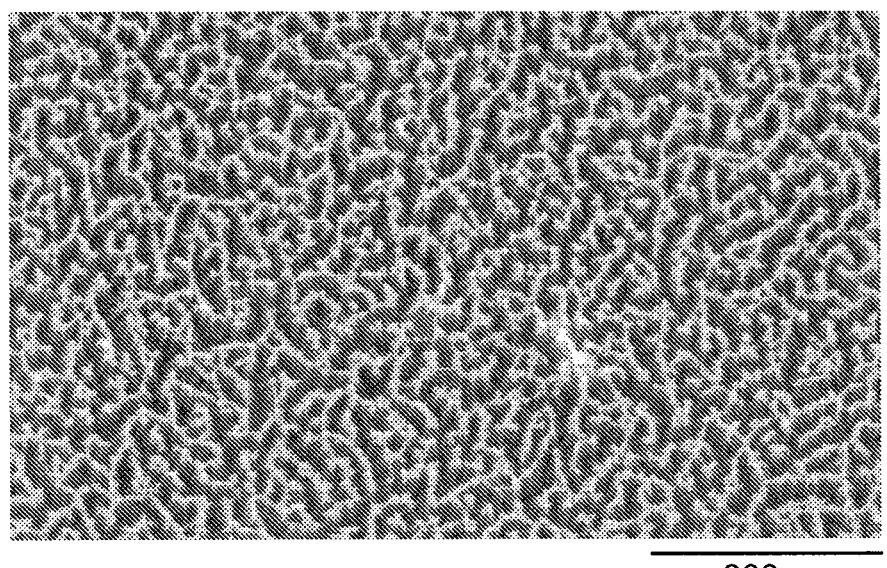
FIG. 7 is a micrograph of the surface of a film etched generally according to the disclosure of WO2011/139593 in Comparative Example 4C below so as to contrast the surface morphology depicted in FIG. 6.

The micrograph of the surface obtained by the plasma treatment of Example 4 is presented in FIG. 6, while a micrograph of the surface obtained in Comparative Example 4C is presented in FIG. 7. It can be seen that the single pass plasma treatment according to the present invention produces noticeably smaller features, and also provides a desirable variability in the height of the nanostructures.

Figure 8A:
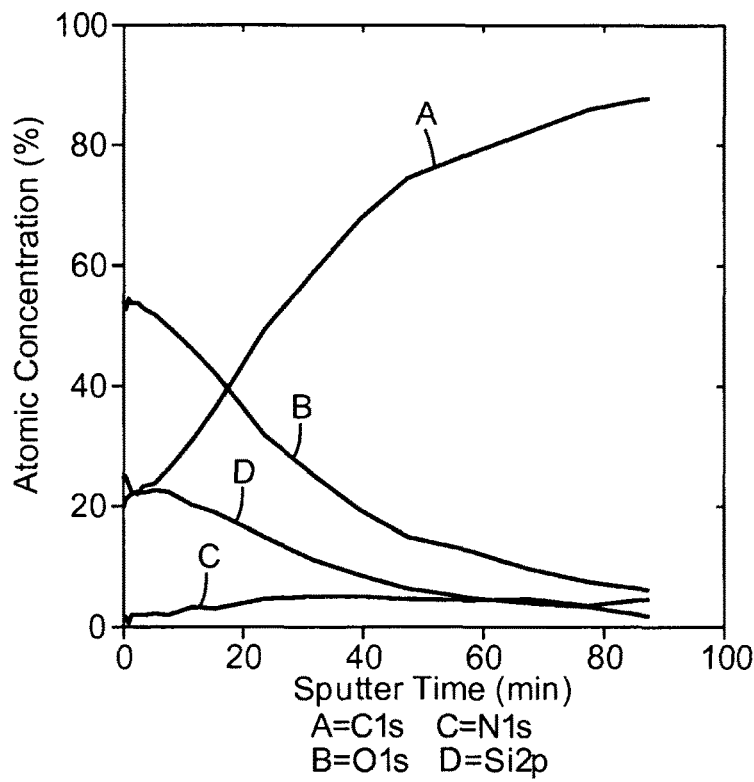
FIGS. 8a and 8b are graphs of atomic concentration vs sputter time for embodiments of articles made according to Example 4 and Comparative Example 4C below respectively.
Figure 8B:
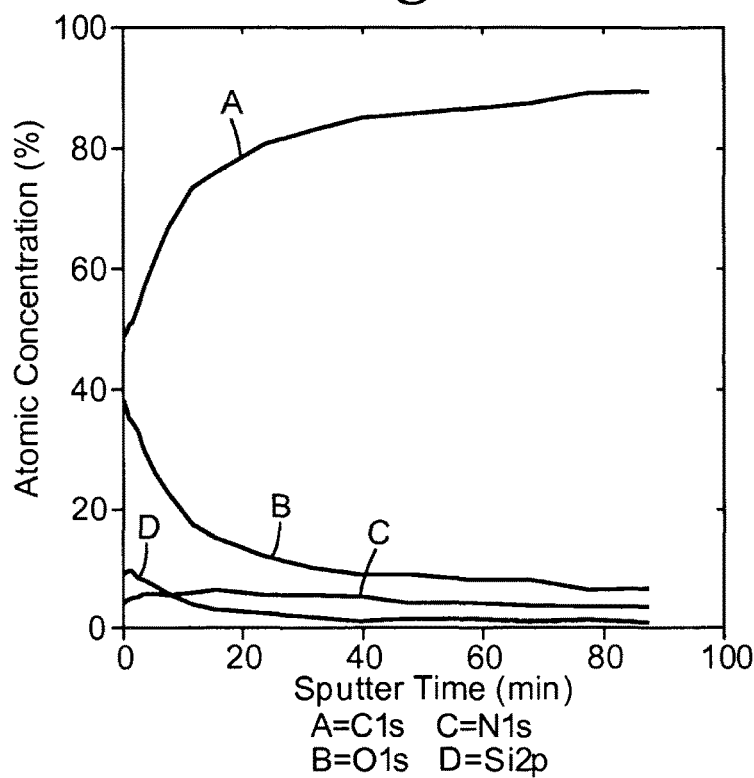

Referring now to FIGS. 8a and 8b, graphs of atomic concentration vs sputter time for embodiments of articles made according to Example 4 and Comparative Example 4C below respectively, are presented. The figures show that the deposited layer comprising silicon using the method of the present invention is present in substantial amounts at greater depths when compared with the method previously disclosed in WO2011/139593 in which the silicon tapers off quickly as a function of depth. In the case of the Comparative Example 4C, silicon concentration drops below 5% quickly, whereas for the case of Example 4, it is more than 5% for most of the etched depth.

Example 5—Nanostructure Formed on Fluorinated Ethylene Propylene (FEP) Film

Sheet samples of fluorinated ethylene propylene (FEP) commercially available as "FEP-6322Z" from 3M-Dyneon of Saint Paul, Minn., extruded to a thickness of 100 microns were attached to a PET carrier film which was mounted within the chamber, the PET film wrapped around the drum electrode, and secured to the take up roll on the opposite side of the drum. The un-wind and take-up tensions were maintained at 3 pounds (13.3 N). The chamber door was closed and the chamber pumped down to a base pressure of $5 \times 10^{-4}$ Torr. The first gaseous species was tetramethylsilane gas provided at a flow rate of 40 sccm and the second gaseous species was oxygen provided at a flow rate of 500 sccm. The pressure during the exposure was around 10 mTorr and plasma was turned on at a power of 6000 watts while the tape was advanced at a speed of 6 ft/min (1.83 m/min).

The adhesion of the nanostructured surface was measured and compared with the bare FEP film without any plasma treatment and the results are as follows:

Average adhesion to nanostructured FEP Film: 63.53+−1.48 oz/in

Average adhesion to control unetched FEP film: 28.44+−0.77 oz/in

Example 6—Nanostructure Formed on Ethylenetetrafluoroethylene (ETFE) Film

A roll of extruded 100 micron thick ethylenetetrafluoroethylene (ETFE) commercially available as ET 6235 Z film by 3M Dyneon of St. Paul, Minn., was mounted within the chamber, the film wrapped around the drum electrode, and secured to the take up roll on the opposite side of the drum. The unwind and take-up tensions were maintained at 3 pounds (13.3 N). The chamber door was closed and the chamber pumped down to a base pressure of $5 \times 10^{-4}$ torr. The first gaseous species was tetramethylsilane gas provided at a flow rate of 40 sccm and the second gaseous species was oxygen provided at a flow rate of 500 sccm. The pressure during the exposure was around 7.5 mTorr and plasma was turned on at a power of 6000 watts while the tape was advanced at a speed of 6 ft/min (1.9 m/min).

Strips of the treated ETFE tape 4 inches (10.2 cm) long were hand laminated to several commercially available tapes, and these laminations were pulled apart by hand to determine the quality of the adhesion. As a control, a similar test was performed on untreated ETFE tape. The results are shown in Table 1. (All the trial tapes are commercially available from 3M Company of St. Paul, Minn.)

TABLE 1

| Tape | Adhesion to untreated ETFE Film | Adhesion to Nanostructured ETFE Film |
| --- | --- | --- |
| 3M BLUE Painter's Tape | Poor, easy to remove | 100%, adhesive split, transfer from backing to ETFE film |
| 3M SCOTCH 810 Office Tape | Poor, easy to remove | 100%, adhesive split, transfer from backing to ETFE film |
| 3M Green Silicone Tape | Medium, easy to remove | Hard to remove, no adhesive transfer |
| 3M Packaging Tape | Poor, easy to remove | 100%, adhesive split, transfer from backing to ETFE film |

The adhesion of the treated ETFE tapes was then assessed with regard to several double-sided adhesive constructions. A 2 inch (5.1 cm) long piece of each double sided adhesive material was laminated at room temperature between two sheets of the nanostructured ETFE film. As a control, a similar test was performed on untreated ETFE tape. The laminates then were pulled apart by hand and the observations were recorded in Table 2. (All the trial tapes are commercially available from 3M Company of St. Paul, Minn.)

TABLE 2

| Tape | Adhesion to ETFE Film | Adhesion to Nanostructured ETFE Film |
| --- | --- | --- |
| 3M VHB | Very poor, does not stick | 100%, adhesive split |
| 3M VHB Acrylic Foam | Poor, does hardly stick | 100%, adhesive split |
| 3M Optically Clear Adhesive | Poor, does hardly stick | 100%, adhesive split |

The adhesion of the treated ETFE tapes was then assessed with regard to several liquid adhesive adhesive constructions. The adhesives were prepared according to the respective instructions. Then a drop of each adhesive was placed between two pieces of ETFE film or Nanostructured ETFE film. The adhesive then were allowed to fully cure for 24 hours. As a control, a similar test was performed on untreated ETFE tape. The laminates then were pulled apart by hand and the observations were recorded in Table 3.

TABLE 3

| Liquid adhesive | Adhesion to untreated ETFE control | Adhesion to Nanostructured ETFE Film |
| --- | --- | --- |
| 3M Quick Set Epoxy 5 min, clear | Very poor, does not adhere | 100%, film splits, adhesive can not be removed |
| 3M Scotch-Weld 1838 B/A Green Epoxy Adhesive | Very poor, does not adhere | 100%, film splits, adhesive can not be removed |

TABLE 3-continued

| Liquid adhesive | Adhesion to untreated ETFE control | Adhesion to Nanostructured ETFE Film |
|---|---|---|
| Dow Corning RTV Sealant 734 (100% Silicone Rubber) | Very poor, does not adhere | 100%, adhesive splits, adhesive can not be removed |

While the specification has described in detail certain exemplary embodiments, it will be appreciated that those skilled in the art, upon attaining an understanding of the foregoing, may readily conceive of alterations to, variations of, and equivalents to these embodiments. Other modifications and variations to the present disclosure may be practiced by those of ordinary skill in the art, without departing from the spirit and scope of the present disclosure, which is more particularly set forth in the appended claims. For example, the illustrated methods can be performed by hand or by different processing steps than illustrated herein.

Furthermore, reference throughout this specification to "one embodiment," "certain embodiments," "one or more embodiments" or "an embodiment," whether or not including the term "exemplary" preceding the term "embodiment," means that a particular feature, structure, material, or characteristic described in connection with the embodiment is included in at least one embodiment of the certain exemplary embodiments of the present disclosure. Thus, the appearances of the phrases such as "in one or more embodiments," "in certain embodiments," "in one embodiment" or "in an embodiment" in various places throughout this specification are not necessarily referring to the same embodiment of the certain exemplary embodiments of the present disclosure. Additionally, the particular features, structures, materials, or characteristics may be combined in any suitable manner in one or more embodiments. Thus, it is further understood that aspects of the various embodiments may be interchanged in whole or part or combined with other aspects of the various embodiments.

All references, patents, or patent applications cited in this specification are incorporated herein by reference in their entirety to the same extent as if each individual publication or patent was specifically and individually indicated to be incorporated by reference in a consistent manner. In the event of inconsistencies or contradictions between portions of the incorporated references and this application, the information in the preceding description shall control. The preceding description, given in order to enable one of ordinary skill in the art to practice the claimed disclosure, is not to be construed as limiting the scope of the disclosure, which is defined by the claims and all equivalents thereto. Various exemplary embodiments have been described. These and other embodiments are within the scope of the following claims.

The invention claimed is:

1. A method of making a nanostructure, comprising:
providing a substrate;
mixing a first gaseous species capable of depositing a layer onto the substrate when formed into a plasma, with a second gaseous species capable of etching the substrate when formed into a plasma, thereby forming a gaseous mixture;
forming the gaseous mixture into a plasma; and
exposing a surface of the substrate to the plasma, wherein the surface is etched and a layer is deposited on at least a portion of the etched surface simultaneously, thereby forming a nanostructure comprising nano-pillars or nano-columns having features of diverse height and aspect ratio.

2. A method of making a nanostructure according to claim 1, wherein the substrate comprises a (co)polymeric material, an inorganic material, an alloy, a solid solution, or a combination thereof.

3. A method of making a nanostructure according to claim 2, wherein the (co)polymeric material comprises a (co)polymer selected from poly(methyl methacrylate), poly(ethylene terephthalate), polycarbonate, cellulose, triacetate, polyamide, polyimide, a fluoropolymer, a polyolefin, a siloxane (co)polymer, a cyclic olefin (co)polymer, a polyurethane, and combinations thereof.

4. A method making a nanostructure according to claim 3, wherein the (co)polymer is a polytetrafluoroethylene fluoropolymer and the surface of the substrate is substantially colorless after exposure to the plasma.

5. A method of making a nanostructure according to claim 1, wherein the substrate comprises a transparent (co)polymer.

6. A method of making a nanostructure according to claim 1, wherein the first gaseous species comprises a compound selected from the group consisting of organosilicon compounds, metal alkyl compounds, metal isopropoxide compounds, metal oxide compounds, metal acetylacetonate compounds, metal halide compounds, and combinations thereof.

7. A method of making a nanostructure according to claim 6, wherein the organosilicon compounds comprise tetramethylsilane, trimethylsilane, hexamethyldisiloxane, tetraethylorthosilicate, a polyhedral oligomeric silsesquioxane, or a combination thereof.

8. A method of making a nanostructure according to claim 1, wherein the second gaseous species comprises oxygen, a fluorocarbon, nitrogen trifluoride, sulfur hexafluoride, chlorine, hydrochloric acid, methane, or a combination thereof.

9. A method of making a nanostructure according to claim 8, wherein the fluorocarbon is selected from tetrafluoromethane, perfluoropropane, and combinations thereof.

10. A method of making a nanostructure according to claim 1, wherein the gaseous mixture further comprises argon.

11. A method of making a nanostructure according to claim 1, wherein the nanostructure has a dimension of less than about 400 nanometers.

12. A method of making a nanostructure according to claim 11, wherein the nanostructure has a dimension of less than about 40 nanometers.

13. An article comprising a nanostructure further comprising nano-pillars or nano-columns having features of diverse height and aspect ratio made from the method according to claim 1.

14. An article according to claim 13, having a Reflectance of less than 3% and a Haze Delta of less than 0.5%, optionally wherein the Reflectance is less than 2%.

15. An article according to claim 13, wherein the etched surface has at least one nanostructure with an aspect ratio greater than 2:1, optionally wherein the etched surface has at least one nanostructure with an aspect ratio greater than 15:1.

16. An article according to claim 13, wherein the deposited species is present over substantially the entire etched surface.

17. The article according to claim 16, wherein the concentration of the deposited species varies continuously according to the depth from the exposed surface.

18. The article according to claim 13, wherein the exposed surface comprises silanol groups.

19. The article according to claim 13, further comprising a layer of pressure sensitive adhesive adhered to the exposed surface, optionally wherein the pressure sensitive adhesive and the substrate are UV stable.

20. The article according to claim 13, wherein the exposed surface has a pattern that is random in at least one dimension, optionally wherein the exposed surface has a pattern that is random in three orthogonal dimensions.

* * * * *

UNITED STATES PATENT AND TRADEMARK OFFICE
CERTIFICATE OF CORRECTION

PATENT NO. : 10,134,566 B2
APPLICATION NO. : 14/895693
DATED : November 20, 2018
INVENTOR(S) : Moses David et al.

It is certified that error appears in the above-identified patent and that said Letters Patent is hereby corrected as shown below:

On the Title Page

Item (57)
Line 20, Delete "meal" and insert -- metal --, therefor.

In the Specification

Column 5
Line 18, After "on a" delete "the".

Column 7
Line 57, Delete "greater," and insert -- greater; --, therefor.

Column 9
Line 35, Delete "triacylate" and insert -- triacrylate --, therefor.

Column 13
Lines 4-5, Delete "FIGS. 4A and 4B" and insert -- FIGS 4$a$ and 4$b$ --.

Column 17
Line 22, Delete "greater," and insert -- greater; --, therefor.
Line 43, Delete "polyanaline;" and insert -- polyaniline; --, therefor.

Column 20
Line 19, Delete "Gardiner" and insert -- Gardner --, therefor.
Line 38, Delete "Gardiner," and insert -- Gardner, --, therefor.

Column 23
Line 63, Delete "Upliex" and insert -- Upilex --, therefor.

Signed and Sealed this
Third Day of March, 2020

Andrei Iancu
*Director of the United States Patent and Trademark Office*

CERTIFICATE OF CORRECTION (continued)
U.S. Pat. No. 10,134,566 B2

Column 26
Line 48, Delete "adhesive adhesive" and insert -- adhesive --, therefor.

In the Claims

Column 28
Line 15, In Claim 4, after "method" insert -- of --.